US006528172B2

United States Patent
Sawada et al.

(10) Patent No.: US 6,528,172 B2
(45) Date of Patent: *Mar. 4, 2003

(54) COATING SOLUTIONS FOR USE IN FORMING BISMUTH-BASED FERROELECTRIC THIN FILMS, AND FERROELECTRIC THIN FILMS, FERROELECTRIC CAPACITORS AND FERROELECTRIC MEMORIES FORMED WITH SAID COATING SOLUTIONS, AS WELL AS PROCESSES FOR PRODUCTION THEREOF

(75) Inventors: Yoshihiro Sawada, Kanagawa-ken (JP); Akira Hashimoto, Kanagawa-ken (JP); Ichiro Koiwa, Tokyo (JP); Juro Mita, Tokyo (JP); Yukihisa Okada, Tokyo (JP); Takao Kanehara, Tokyo (JP); Hiroyo Kato, Tokyo (JP)

(73) Assignees: Tokyo Ohka Kogyo Co., Ltd., Kawasaki (JP); Oki Electric Industry Co., Ltd., Tokyo (JP)

( * ) Notice: Subject to any disclaimer, the term of this patent is extended or adjusted under 35 U.S.C. 154(b) by 81 days.

This patent is subject to a terminal disclaimer.

(21) Appl. No.: 09/748,160

(22) Filed: Dec. 27, 2000

(65) Prior Publication Data

US 2001/0010867 A1 Aug. 2, 2001

Related U.S. Application Data

(62) Division of application No. 09/008,245, filed on Jan. 15, 1998, now Pat. No. 6,197,102.

(30) Foreign Application Priority Data

Jan. 18, 1997 (JP) ................................................ 9-19834
Jun. 26, 1997 (JP) ............................................... 9-185872

(51) Int. Cl.[7] ........................... G11C 11/22; G11C 11/23

(52) U.S. Cl. ...................... 428/470; 428/469; 428/472; 428/689; 428/697; 428/701; 365/145; 365/149; 427/126.3; 427/383.1

(58) Field of Search ................................. 428/469, 470, 428/472, 701, 697, 446, 689; 427/126.3, 383.1; 106/287.19; 361/271; 365/145, 149

(56) References Cited

U.S. PATENT DOCUMENTS 4,579,594 A    4/1986   Nanao et al. .......... 106/287.24

(List continued on next page.)

FOREIGN PATENT DOCUMENTS

JP     61-86423     5/1986

(List continued on next page.)

OTHER PUBLICATIONS

T. Takenaka, *Jpn. Soc. Appl. Phys.*, Catalog No. AP 942235, No. 456, pp. 1–8 (Nov. 22, 1994).

(List continued on next page.)

*Primary Examiner*—Deborah Jones
*Assistant Examiner*—Stephen Stein
(74) *Attorney, Agent, or Firm*—Wenderoth, Lind & Ponack, L.L.P.

(57) ABSTRACT

The invention discloses a coating solution for use in forming Bi-based ferroelectric thin films containing Bi, metallic element A (at least one selected from the group consisting of Bi, Pb, Ba, Sr, Ca, Na, K and rare earth elements) and metallic element B (at least one selected from the group consisting of Ti, Nb, Ta, W, Mo, Fe, Co and Cr), wherein it contains metal alkoxides of Bi, metallic element A and metallic element B respectively, and an organometallic compound obtainable by hydrolyzing composite metal alkoxides, formed by any two or more of said metal alkoxides, with water alone or in combination with a catalyst, and contains Bi in a molar amount 1–1.1 times as great as the stoichiometric amount; a ferroelectric thin film (5), a ferroelectric capacitor (10) and a ferroelectric memory with the use of such a coating solution; and a method for producing the same.

10 Claims, 10 Drawing Sheets

U.S. PATENT DOCUMENTS

| | | | |
|---|---|---|---|
| 4,668,299 A | 5/1987 | Nanao et al. | 106/419 |
| 5,196,388 A | 3/1993 | Shyu | 501/134 |
| 5,271,797 A | 12/1993 | Kamisawa | 216/87 |
| 5,593,495 A | 1/1997 | Masuda et al. | 117/4 |
| 5,627,013 A | 5/1997 | Kamisawa | 430/325 |
| 5,972,096 A | 10/1999 | Sawada et al. | 106/287.18 |
| 6,120,912 A * | 9/2000 | Sawada et al. | 428/470 |
| 6,303,231 B1 * | 10/2001 | Sawada et al. | 428/470 |

FOREIGN PATENT DOCUMENTS

| | | |
|---|---|---|
| JP | 5-298920 | 11/1993 |
| JP | 7-315810 | 12/1995 |
| JP | 8-91841 | 4/1996 |
| JP | 8-283949 | 10/1996 |
| JP | 9-77592 | 3/1997 |
| WO | WO94/10084 | 5/1994 |
| WO | WO96/30938 | 10/1996 |
| WO | WO96/41375 | 12/1996 |

OTHER PUBLICATIONS

T. Shiosaki, *Ceramics*, 30(6) 499–507 (1995). No month.

T. Atsuki et al., *Proceeding of the 12th Meeting of Ferroelectric Materials and Their Applications* May 24–27, 1995, 57–58 (1995). No month.

H. Watanabe et al., *Proceeding of the 12th Meeting of Ferroelectric Materials and Their Applications* May 24–27, 1995, 139–140 (1995). No month.

T. Atsuki et al., *Jpn. J. Appl. Phys.*, 34, 5096–5099 (Sep. 1995).

*Patent Abstracts of Japan*, 17(518) (E–1434), abstract of JP 05–136471 (Sep. 1993).

WIPDS, Derwent Information Ltd., AN 86–152949 (1997). No month.

* cited by examiner

COATING SOLUTIONS FOR USE IN FORMING BISMUTH-BASED FERROELECTRIC THIN FILMS, AND FERROELECTRIC THIN FILMS, FERROELECTRIC CAPACITORS AND FERROELECTRIC MEMORIES FORMED WITH SAID COATING SOLUTIONS, AS WELL AS PROCESSES FOR PRODUCTION THEREOF

This is a divisional application of Ser. No. 09/008,245, filed Jan. 15, 1998 now U.S. Pat. No. 6,197,102.

BACKGROUND OF THE INVENTION

1. Field of the Invention

The present invention relates to coating solutions for use in forming Bi-based ferroelectric thin films, and ferroelectric thin films, ferroelectric capacitors and ferroelectric memories formed with said coating solutions, as well as processes for production thereof. More particularly, the invention relates to coating solutions that lead to only a small amount of separation (segregation, precipitation) of excessive metallic elements' particles, little leakage current, are excellent in hydrogen heat treatment resistance as well as voltage resistance, are capable of forming dense Bi-based ferroelectric thin films, and have good keeping quality. The invention also relates to ferroelectric thin films, ferroelectric capacitors and ferroelectric memories formed with such coating solutions, as well as processes for the production thereof.

2. Description of Related Art

Thin films of bismuth layer-structured ferroelectrics (BLSF) represented by the general formula $(Bi_2O_2)^{2+}(A_{m-1}B_mO_{3m+1})^{2-}$ [where A is a mono-, di- or trivalent ion (as of Bi, Pb, Ba, Sr, Ca, Na, K or a rare earth element) or combinations of these ions; B is a tetra-, penta- or hexavalent ion (as of a metallic element like Ti, Nb, Ta, W, Mo, Fe, Co or Cr) or combinations of these ions; and m is an integer of 1–5] have recently been found to feature good characteristics such as requiring small coercive field in remanent polarization P-E hysteresis curves and hence experiencing less fatigue as a result of repeated polarization switching. This has spotlighted the potential use of BLSF thin films as materials for the fabrication of semiconductor memories and sensors (T. Takenaka, "Bismuth Layer-Structured Ferroelectrics and Their Grain Orientation" in Report of the Workshop on Applied Electronics Properties, The Japan Society of Applied Physics, pp. 1–8, Nov. 22, 1994; and "Ceramics", vol. 30, No. 6, pp. 499–503, 1995). Among the BLSF thin films so far reported, those of an $SrBi_2Ta_2O_9$ system which are represented by the formula $(Bi_2O_2)^{2+}(SrTa_2O_7)^{2-}$ are of particular interest since the desired characteristics are conspicuous in them.

Such BLSF thin films can be formed by various methods including sputtering, CVD and coated film formation. However, due to the many metal oxides that have to be incorporated as constituents, sputtering and CVD techniques require costly apparatus and considerable difficulties are involved in controlling the composition of ferroelectric thin films at desired levels; hence, these techniques are not suitable for practical applications, particularly on large-diameter substrates. In contrast, the coated film formation technique does not need expensive apparatus and can deposit films at relatively low cost; in addition, they provide ease in controlling the composition of ferroelectric thin films at desired levels. Therefore, the coated film process for the formation of BLSF thin films holds much promise for commercial use.

While several formulations have been proposed for use as coating solutions in the formation of BLSF thin films by the coated film process, two typical cases are those prepared by dissolving carboxylate (e.g., 2-ethylhexanate) of Sr and Bi and alkoxides of Ta in acetate esters (Proceedings of the 12th Ferroelectric materials and their Applications meeting on May 24–27, 1995, Paper presented by Mitsubishi Materials Corporation, 24-TP-11, pp. 57–58; and "Jpn. J. Appl. Phys.", vol. 34, pp. 5096–5099, 1995) and those prepared by dissolving 2-ethylhexanate of Sr, Bi, Ta, Nb, Ti, etc. in xylene to form coating solutions of a metalloorganic decomposition (MOD) type (Proceedings of the 12th Ferroelectric Materials and their Applications meeting on May 24–27, 1995, Paper presented by Olympus Optical Co., Ltd. and Symetrix Corporation, 26-TC-10, pp. 139–140). However, these coating solutions have had various problems. First, the 2-ethylhexanate of the respective metal components has a long-chain ($C_8$) organic group, so a large portion of the coating solution is occupied by the organic content and there is much loss in the coating weight due to the burning out of the organic content in the process of film formation consisting of the application of the coating solution, baking of the applied coating and crystallization and a porous film will result. In addition, the surface morphology of the coating film is not satisfactory enough to provide for easy application to the fabrication of VLSI devices. Further in addition, in order to form a thin film using the applied coating, the applied coating has to be annealed twice at an elevated temperature of 800° C. to ensure appropriate electrical characteristics thereof, however, this is problematic from the viewpoint of semiconductor fabrication process. It is pointed out that in the conventional BLSF-based coating solutions, high-volatility metals such as Bi are burnt out on forming a thin film, particularly during prebaking and annealing, and therefore electrical characteristics are impaired. Attempt have been made to add in advance high-volatility Bi excessively in a molar amount 1.15–1.3 times as great as the stoichiometric amount to the coating solution in order to compensate the loss of burnout of Bi.

The foregoing "Jpn. J. Appl. Phys." vol. 34 (1995) reports that thin films which contain Sr in an amount of smaller than stoichiometric amount have improved in their film characteristics such as crystallinity.

Even when using a coating solution having a composition out of the theoretical amount (stoichiometric amount) as mentioned above, it was difficult to form a BLSF film of a composition eventually satisfying the stoichiometry since the amount of burnout of metallic elements differ from one another, depending on annealing conditions. Such a BLSF film out of stoichiometry is apt to suffer defects in the film, and therefore excessive metallic elements sometimes separate among particles (grain boundaries) during the growth of the crystallized particles. Particularly, fine particles rich in Bi may separate at grain boundaries and cause an increase in leakage current. When applying a ferroelectric memory processed by using the film above to an actual semiconductor device memory having a very small area, problems such as film fatigue resulting from repeated polarization switching, increase in leakage current, and decrease in hydrogen heat treatment resistance and voltage resistance are posed under the effect of the aforesaid defects and film non-uniformity caused by precipitates.

On the other hand, a rapid heating method for forming a film known as RTP (Rapid Thermal Processing) is now attracting the general attention because of such favorable merits as the possibility of accomplishing a baking treatment in a very short period of time, and hence of reducing damages to the substrate, and of applying heat uniformly to inside and outside of the substrate. The present inventors have confirmed that the foregoing fine particles rich in Bi apparently separate at grain boundaries on forming a film by RTP.

Although it is desirable to form a film from the very beginning of whose composition is closest to the stoichiometric composition, the amount of burnout of Bi and other metallic elements during a formation of a thin film differ from one another due to the conditions of the thin film. It was therefore difficult to form a film having a composition close to the stoichiometric composition in the conventional BLSF-based coating solutions.

The prior art coating solutions have further problems. The long-chained metal carboxylates (metallic soaps) of monobasic acids which are commonly used in the coating solutions are generally slightly soluble in polar solvents and, hence, aromatic solvents such as xylene and toluene are used to prepare the coating solutions. However, the coating solutions using such aromatic solvents have to be stored in glass or metallic containers in order to ensure that the evaporating solvents will not be lost to the ambient atmosphere. On the other hand, glass and metallic containers have the disadvantage that metallic components will dissolve out into the coating solution and this is by no means desirable in the art of semiconductor fabrication which hates the contamination with metallic impurities. Under these circumstances, it is preferred to use polyethylene or polypropylene containers which release only negligible amounts of contaminating metallic impurities, which can be protected against mechanical shocks by simple handling procedures and which are less costly and it is desired to use solvents that will leak out of the plastic containers in negligibly small amounts.

The aforementioned aromatic solvents are also very toxic to humans and subject to increasingly rigorous regulations in the methods of use, management and so forth.

If the long-chained metal carboxylates of monobasic acids are replaced by short-chained metal carboxylates of monobasic acids, little solubility is achieved in practical organic solvents. Lower alkoxides of metals are soluble in several polar solvents but on account of the great tendency to be hydrolyzed with moisture in the air, they have only poor keeping quality and practically acceptable levels of reproduction cannot be achieved in the result of coating operations.

It is the common practice to form a ferroelectric memory by providing a lower electrode/a ferroelectric thin film/an upper electrode on a substrate, and in the preceding or subsequent step of the following aluminum wiring step, form a protective film of $SiO_2$ or the like (passivation) on the upper electrode. However, it is reported that, in a conventional memory which comprises, for example, Pt/PZT/Pt using Pb(Zr, Ti)$O_3$ (hereinafter abbreviated as "PZT") as ferroelectric materials, the ferroelectric film deteriorate in its properties during the passivation ("Progress and Production Technique of Ferroelectric Memory/LSI", the 45th VLSI Forum, VLSI Report, Press Journal Co., Ltd., Feb. 28, 1997; Preprint for the 44th Appl. Phys. Related Soc. Meeting, No. 2, pp. 435–436, Mar. 28–31, 1997).

This is attributable to the fact that, because monosilane ($SiH_4$) is used as a material for forming the passivation film, hydrogen generated from $SiH_4$ during film forming is dissociated by the catalytic action of Pt of the upper electrode into an atomic-state hydrogen (hydrogen radical) having a strong reducibility, resulting in breakage of the PZT film.

This film breakage poses such problems as film peeling between Pt and PZT, deterioration of hysteresis characteristics. A repeated polarization switching also may not be available.

This film breakage is caused by the presence of atomic-state hydrogen having a high reducibility and reduction of the PZT ferroelectric film, which is an oxide film, by the heat treatment. When using a ferroelectric film other than a PZT, a similar film breakage is considered to occur particularly when using Pt for the upper electrode.

Since Bi has been excessively added in the conventional BLSF films, the excess Bi precipitates at grain boundaries, which is easily reduced through a heat treatment in a hydrogen (reducing) atmosphere, and this may cause film deterioration including an increase in leakage current.

When a BLSF film is reduced by the formation of an $SiO_2$ passivation film prior to forming an aluminum wiring, it is possible to bring the reduced BLSF film back to the normal state by applying a heating treatment in an oxygen atmosphere. When the BLSF film is reduced by the formation of an $SiO_2$ passivation film after forming an aluminum wiring, the heating temperature is limited due to reflowability of aluminum, and it is difficult to bring the BLSF film back to the normal state.

It is usual to apply an operation known as "sintering" comprising the steps of, after forming the aluminum wiring, performing a heat treatment by the use of a mixed gas of several percent hydrogen and nitrogen or an inert gas such as argon, and improving conductivity on the interface between the aluminum wiring and the electrode. This however causes deterioration of the BLSF film because of the presence of hydrogen having a high reducibility.

It is therefore required to be free from deterioration of the film during formation of the passivation film and in sintering, and to be excellent in hydrogen heat treatment resistance.

Under these circumstances, it has been strongly desired to develop a coating solution that is capable of forming highly dense films of good quality, which lead to little leakage current and are excellent in hydrogen heat treatment resistance and pressure resistance, with minimal coating weight loss due to the burning of the organic content and separation (segregation) of metallic elements in the coating solution and which is soluble in practical organic solvents and which have good keeping quality.

The term "hydrogen heat treatment resistance" of a ferroelectric thin film as used in this specification means deterioration resistance of a ferroelectric thin film against hydrogen having a high reducibility, which occurs during formation of an $SiO_2$ passivation film or upon sintering treatment after formation of an aluminum wiring.

SUMMARY OF THE INVENTION

An object of the present invention is therefore to provide a coating solution that contains an organometallic compound soluble in practical organic solvents, that leads to little leakage current, is excellent in hydrogen heat treatment resistance and voltage resistance and is capable of forming dense Bi-based ferroelectric thin films, that has good keeping quality and that ensures highly reproducible results in coating operations.

Another object of the invention is to provide Bi-based ferroelectric thin films using the coating solution.

Yet another object of the invention is to provide a ferroelectric capacitor and a ferroelectric memory using the coating solution, particularly to provide Bi-based ferroelectric thin films, a ferroelectric capacitor and a ferroelectric memory permitting inhibition of separation (segregation) of metallic elements such as Bi in the formation of a film by the RTP method.

As a result of intensive studies made in order to solve the foregoing problems, the present inventors obtained the following findings. Any of the conventional BLSF-based coating solutions is prepared by only mixing metal carboxylates, metal alkoxide compounds and the like in an organic solvent. This forms a factor causing occurrence of burnout of metallic elements and a burning loss of organic constituents in large quantities during the baking (annealing) step and causing segregation of some metallic elements such as Bi at grain boundaries, thereby causing a decrease in film forming density, an increase in leakage current and reduction of hydrogen heat treatment resistance and voltage resistance. It is possible to solve the foregoing problems by converting metal compounds forming the BLSF thin film into a composite compound and hydrolyzing the same, thereby growing the metalloxane bond of each metallic element. It is also possible to achieve improvement of various properties as a ferroelectric capacitor or a ferroelectric memory through further improvement of hydrolysis rate and hence inorganic properties of the coating solution by increasing keeping stability and polarity of the coating solution during or after hydrolysis resulting from reaction of the stabilizer. The inventors have accomplished the present invention as a result of these findings.

More specifically, the present invention relates to a coating solution for use in forming Bi-based ferroelectric thin film containing Bi, metallic element A (which is at least one metallic element selected from the group consisting of Bi, Pb, Ba, Sr, Ca, Na, K and rare earth elements) and metallic element B (which is at least one metallic element selected from the group consisting of Ti, Nb, Ta, W, Mo, Fe, Co and Cr), wherein it contains metal alkoxides of Bi, metallic element A (A as defined hereabove) and metallic element B (B as defined hereabove) respectively, and an organometallic compound obtainable by hydrolyzing composite metal alkoxides, formed by any two or more of said metal alkoxides, with water alone or in combination with a catalyst, and contains Bi in a molar amount 1–1.1 times as great as the stoichiometric amount.

The invention relates to a ferroelectric thin film formed by applying the foregoing coating solution onto an electrode on a substrate, optionally exposing the applied coating to a humidified atmosphere and then baking(annealing) the coating.

The invention further relates to a ferroelectric capacitor having an electrode formed on the above-mentioned ferroelectric thin film.

The invention relates to a ferroelectric memory using the aforesaid capacitor.

In addition, the invention relates to a process producing a ferroelectric thin film by the steps of:

(I) forming an electrode over a substrate;
(II) applying a coating solution for use in forming a ferroelectric thin film onto the electrode; and
(III) annealing the applied coating;

wherein the process uses, as the coating solution for use in forming ferroelectric thin films, a Bi-based coating solution for use in forming ferroelectric thin films, containing Bi, metallic element A (which is at least one metallic element selected from the group consisting of Bi, Pb, Ba, Sr, Ca, Na, K and rare earth elements) and metallic element B (which is at least one metallic element selected from the group consisting of Ti, Nb, Ta, W, Mo, Fe, Co and Cr), wherein it contains metal alkoxides of Bi, metallic element A (A as defined hereabove) and metallic element B (B as defined hereabove) respectively, and an organometallic compound obtainable by hydrolyzing composite metal alkoxides, formed by any two or more of said metal alkoxides, with water alone or in combination with a catalyst, and contains Bi in a molar amount 1-1.1 times as great as the stoichiometric amount.

Further, the invention relates to a process for producing a ferroelectric capacitor by the steps of:

(I) forming an electrode over a substrate;
(II) applying a coating solution for use in forming a ferroelectric thin film onto the electrode;
(III) annealing the applied coating to form a ferroelectric thin film; and
(IV) forming an electrode over the ferroelectric thin film;

wherein the process uses, as the coating solution for use in forming ferroelectric thin films, a Bi-based coating solution for use in forming ferroelectric thin films, containing Bi, metallic element A (which is at least one metallic element selected from the group consisting of Bi, Pb, Ba, Sr, Ca, Na, K and rare earth elements) and metallic element B (which is at least one metallic element selected from the group consisting of Ti, Nb, Ta, W, Mo, Fe, Co and Cr), wherein it contains metal alkoxides of Bi, metallic element A (A as defined hereabove) and metallic element B (B as defined hereabove) respectively, and an organometallic compound obtainable by hydrolyzing composite metal alkoxides, formed by any two or more of said metal alkoxides, with water alone or in combination with a catalyst, and contains Bi in a molar amount 1-1.1 times as great as the stoichiometric amount.

DETAILED DESCRIPTION OF THE INVENTION

Figure 1:
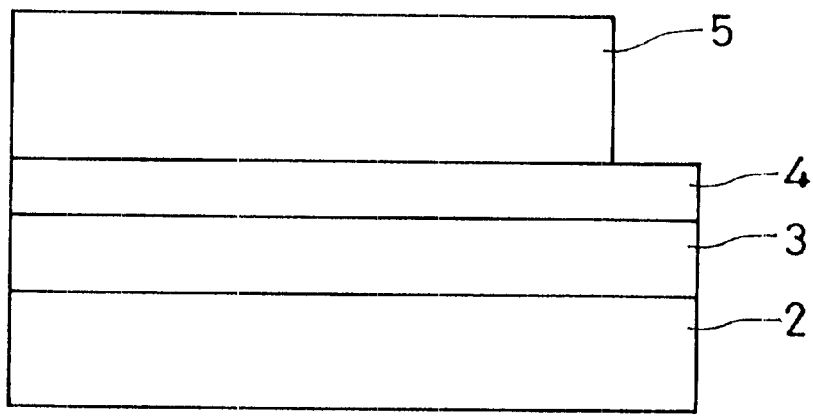
FIG. 1 shows schematically a structure of the ferroelectric thin film of the invention.

Unless otherwise noted, the expression reading "a saturated or unsaturated hydrocarbon group having 1–6 carbon atoms" refers to a group with 1–6 carbon atoms that comprises carbon and hydrogen atoms in the presence of single or unsaturated carbon—carbon bonds. The "hydrocarbon group" to be used in the invention is either an aromatic or an aliphatic hydrocarbon group but aliphatic hydrocarbon groups are preferred, with alkyl group being particularly preferred.

The "alkyl group having 1–6 carbon atoms" may be either straight-chained or branched and is exemplified by methyl, ethyl, propyl, i-propyl, butyl, t-butyl, pentyl, neopentyl and hexyl groups.

The "alkoxyl group having 1–6 carbon atoms" may be either straight-chained or branched and is exemplified by methoxy, ethoxy, propoxy, i-propoxy, butoxy, t-butoxy and neopentoxy groups.

The coating solution for use in forming Bi-based ferroelectric thin films of the invention contains Bi, metallic element A (which is at least one metallic element selected from the group consisting of Bi, Pb, Ba, Sr, Ca, Na, K and rare earth elements) and metallic element B (which is at least one metallic element selected from the group consisting of Ti, Nb, Ta, W, Mo, Fe, Co and Cr), which further contains metal alkoxides of Bi, metallic element A (A as defined hereabove) and metallic element B (B as defined hereabove), and an organometallic compound available by hydrolyzing a composite metal alkoxide formed by any two or more of said metal alkoxides, with water alone or in combination with a catalyst, and contains Bi in a molar amount 1-1.1 times as great as the stoichiometric amount.

It is preferable to use, as the aforesaid coating solution for use in forming a Bi-based ferroelectric thin film, a coating solution for use in forming Bi-based ferroelectric thin films, wherein the Bi-based ferroelectric thin films are represented by the general formula (I):

$$A_aBi_xB_bO_y \qquad (I)$$

where A is at least one metallic element selected from the group consisting of Bi, Pb, Ba, Sr, Ca, Na, K and rare earth elements; B is at least one metallic element selected from the group consisting of Ti, Nb, Ta, W, Mo, Fe, Co and Cr; and $1 \leq x \leq 4$, $0.5 \leq a \leq 2$, $2 \leq b \leq 5$, and y=[3x+a (valency of metallic element A)+b (valency of metallic element B)]/2.

In the solution for forming Bi-based ferroelectric thin films of the invention, organometallic compounds are preferably contained therein, that are obtainable by (1) reacting the composite metal alkoxides with a stabilizer, followed by hydrolyzing them with water alone or in combination with a catalyst; or (2) hydrolyzing the composite metal alkoxides with water alone or in combination with the catalyst, followed by. reacting them with the stabilizer. These organometallic compounds, especially the compounds obtained by (1) above, may further be reacted with the stabilizer. The stabilizer mentioned above should preferably be at least one selected from the group consisting of carboxylic anhydrides, dicarboxylic acid monoesters, β-diketones and glycols.

The aforesaid composite metal alkoxides are exemplified as the following specific examples (a)-(d):

(a) composite metal alkoxides including ABi composite metal alkoxide and B metal alkoxide;

(b) composite metal alkoxides including BiB composite metal alkoxide and A metal alkoxide;

(c) composite metal alkoxides including AB composite metal alkoxide and Bi metal alkoxide; and (d) composite metal alkoxides including ABiB composite metal alkoxide.

More specifically, the composite metal alkoxides in the present invention include composite metal alkoxides comprising at least two different metal alkoxides selected from the group consisting of metallic element A, metallic element B and Bi. By forming a composite material from two or more different metal alkoxides, it is possible to inhibit separation (segregation) of a metallic element each and burnout thereof.

A composite metal alkoxide as used in the invention is a compound obtainable by refluxing different metal alkoxides in a solvent at a temperature within a range of from 30 to 100° C. for about 2 to 15 hours. Toward the end of reaction, the liquid is gradually discolored to finally become a brown liquid. The time point when the liquid has completely been discolored as described above may be regarded as the end point of reaction. The composite metal alkoxide thus obtained is considered to be one defined in the "Manufacturing Method of Glass Ceramics by Sol-Gel Process and Applications" (Applied Tech. Pub. Co., Jun. 4, 1989), pp. 46–47, and to be expressed in detail by: $ABi(OR^1)_m(OR^2)_3$, $BBi(OR^3)_n(OR^2)_3$, $AB(OR^1)_m(OR^3)_n$, $ABBi(OR^1)_m(OR^3)_n(OR^2)_3$ (where A and B are as defined hereabove; m is a valency of metallic element A; n is a valency of metallic element B; and $R^1$, $R^2$ and $R^3$ respectively represent alkyl groups having 1–6 carbon atoms independently of each other). Among these, $ABi(OR^1)_m(OR^2)_3$, $BBi(OR^3)_n(OR^2)_3$, or $ABBi(OR^1)_m(R^3)_n(OR^2)_3$, those are composite compounds of Bi are preferably used in order to inhibit separation (segregation) of Bi that is believed to have a particularly high sublimation.

The metal alkoxides and the composite metal alkoxides are formed from alcohols which are preferably represented by the general formula (VI):

$$R^8OH \qquad (VI)$$

where $R^8$ is a saturated or unsaturated hydrocarbon group having 1–6 carbon atoms. Specific examples of such alcohols include methanol, ethanol, propanol, butanol, amyl alcohol and cyclohexanol.

Apart from these, alcohols in which hydrogen atoms in $R^8$ are substituted by alkoxyl groups of 1–6 carbon atoms may also be used and specific examples include methoxymethanol, methoxyethanol, ethoxymethanol and ethoxyethanol.

The coating solution of the invention contains organometallic compounds obtainable by hydrolyzing the foregoing composite metal alkoxides with water alone or in combination with a catalyst.

In these metal alkoxides and composite metal alkoxides, part of the alkoxyl groups may be substituted with carboxylic anhydride, dicarboxylic acid monoester, β-diketone or glycol described later.

In order to perform the hydroxylic reaction, water alone or in combination with a catalyst may be added to the coating solution, which then is stirred at 20–50° C. for several hours to several days. Any catalysts such as metal alkoxides that are known in the art of hydrolysis may be employed and exemplary catalysts include acid catalysts such as inorganic acids including, for example, hydrochloric acid, sulfuric acid and nitric acid; and organic acids such as acetic acid, propionic acid and butyric acid; and inorganic or organic alkali catalysts such as sodium hydroxide, potassium hydroxide, ammonia, monoethanolamine, diethanolamine and tetramethylammonium hydroxide. In the present invention, it is particularly preferable to use an acid catalyst because, for inorganic alkali catalysts such as sodium hydroxide and potassium hydroxide, metallic ions of sodium and potassium may remain in the coating solution and therefore may exert an adverse effect on the electric properties of the film, and for nitrogen-containing alkali catalysts such as ammonia and amine, a high-boiling-point nitride compound may be formed after hydrolysis and may exert an adverse effect on densification of the film during baking (annealing).

Hydrolysis may also be performed by exposing the surface of the as-applied coating on an electrode to a humidified atmosphere at a temperature of about 50–12° C. for about 10–60 minutes at a humidity of about 50–100%.

The conditions of hydrolytic reaction are in no way limited to those set forth above and they may be selected as appropriate for the specific use of the coating.

The hydrolytic treatment is effective in not only reducing the organic content of the dried coating but also forming metaloxane bonds of metallic elements, and hence, the separation (segregation) of Bi and other metallic elements, as well as the loss of the organic content due to burning, can be suppressed. The reason would be as follows: Each of the organometallic compounds has respective organic groups in its structure. Hydrolytic treatment causes elimination of organic groups such as alkoxyl groups and thereby metalloxane bonds can be made of a higher inorganic property. The eliminated organic groups are to be low-boiling-point alcohols and glycols. Those alcohols and glycohols remain in the coating solution or the film, however, are evaporated together with the solvent in the drying step. Therefore, inorganic property of the film becomes higher before submitted to annealing process, thereby a dense film may be formed. The composite metal compounds and the metalloxane bonds are attributed to strengthen binding of the metallic elements, and therefore separation (segregation) and burning of f of metallic elements such as Bi, and increase of a leakage current can be suppressed. This makes it possible to form a film having little leakage current and is excellent in hydrogen heat treatment resistance and voltage resistance.

Organometallic compounds, which are preferably contained in the solution for forming Bi-based ferroelectric thin films of the invention, are optionally obtainable by (1) reacting the composite metal alkoxides with a stabilizer, and then hydrolyzing them with water alone or in combination with a catalyst, or (2) hydrolyzing the composite metal alkoxides with water alone or in combination with the catalyst, and then reacting them with a stabilizer.

The above-mentioned stabilizer is for improving the keeping stability of the coating solution, and in the invention, at least one selected from the group consisting of carboxylic anhydrides, dicarboxylic acid monoesters, β-diketones, and glycols is preferably employed.

Regarding carboxylic anhydrides, at least one compound is preferably used as selected from among the carboxylic anhydrides represented by the general formula (II):

$$R^1(CO)_2O \qquad (II)$$

where $R^1$ is a divalent saturated or unsaturated hydrocarbon group having 1–6 carbon atoms. Specific example of the carboxylic anhydrides that can be used in the invention include maleic anhydride, citraconic anhydride, itaconic anhydride, succinic anhydride, methylsuccinic anhydride, glutaric anhydride, α-methylglutaric anhydride, α,α-dimethylglutaric anhydride and trimethylsuccinic anhydride.

At least one compound is preferably used as dicarboxylic acid monoesters as selected from among the dicarboxylic acid monoesters represented by the general formula (III):

$$R^2OCOR^3COOH \qquad (III)$$

where $R^2$ is a saturated or unsaturated hydrocarbon group having 1–6 carbon atoms; $R^3$ is a divalent saturated or unsaturated hydrocarbon group having 1–6 carbon atoms.

Such dicarboxylic acid monoesters may be half esters prepared by reacting dibasic carboxylic acids with alcohols. Specific examples of dibasic carboxylic acids are oxalic acid, malonic acid, succinic acid, glutaric acid, adipic acid, pimelic acid, suberic acid, azelaic acid, sebacic acid, maleic acid, citraconic acid, itaconic acid, methylsuccinic acid, α-methylglutaric acid, α,α-dimethylglutaric acid and trimethylglutaric acid; at least one of these dibasic acids may be esterified with at least one alcohol as selected from among methyl alcohol, ethyl alcohol, propyl alcohol, butyl alcohol, amyl alcohol, hexyl alcohol, ethylene glycol monomethyl ether, propylene glycol monomethyl ether, etc., by known methods.

At least one compound is preferably used as β-diketones as selected from among the β-diketones including the β-ketoesters represented by the general formula (IV):

$$R^4COCR^5HCOR^6 \qquad (IV)$$

where $R^4$ is a saturated or unsaturated hydrocarbon group having 1–6 carbon atoms; $R^5$ is H or $CH_3$; and $R^6$ is an alkyl or alkoxy group having 1–6 carbon atoms.

Specific examples of the β-diketones to be used in the invention include acetylacetone, 3-methyl-2,4-pentanedione and benzoylacetone. Exemplary β-ketoesters include ethyl acetoacetate and diethyl malonate. Other complex formers may of course be employed; however, dipivaloylmethane and THF adducts thereof, as well as complex formers such as hexafluoroacetylacetone that form metal halides after annealing are not suitable for use in the production of the coating solution of the invention since they form highly sublimable or volatile metal complexes.

At least one compound is preferably used as glycols as selected from among the glycols represented by the general formula (V):

$$HOR^7OH \qquad (V)$$

where $R^7$ is a divalent saturated or unsaturated hydrocarbon group having 1–6 carbon atoms.

Specific examples of the glycols that can be used in the invention include ethylene glycol, diethylene glycol, propylene glycol, dipropylene glycol, butane diol, pentane diol, hexylene glycol and glycerin glycol. These glycols are especially effective when they are used in combination with β-diketones as a stabilizer and the effect to be achieved is the enhanced stability of the liquid after subsequent hydrolysis.

The stabilizers mentioned above are preferably be short-chained ones having 1–6 carbon atoms in order to enhance the polarity of the metal compounds and inorganic property of the film after the drying step.

The BLSF-based coating solution of the invention contains in advance Bi in a molar amount in excess of the stoichiometric amount, i.e., in a molar amount 1–1.1 times as great as the stoichiometric amount, taking account of the burnout loss of Bi during formation of the BLSF thin film.

The term "stoichiometric amount" as used herein means the number of moles of each metallic element of the BLSF thin film as expressed by a theoretical formula $(Bi_2O_2)^{2+}(A_{m-1}B_mO_{3m+1})^{2-}$ [where A represents any of mono-, di- and trivalent ions (e.g., Bi, Pb, Ba, Sr, Ca, Na, K and rare earth elements) and combinations thereof; B is any of tetra-, penta- and hexavalent ions (e.g., metallic elements such as Ti, Nb, Ta, W, Mo, Fe, Co and Cr) and combinations thereof; and m is an integer of 1–5]. When m=2, for example, the above formula takes the form of $ABi_2B_2O_9$ with stoichiometric amount for the individual metallic elements of: metallic element A=1 mole, element Bi=2 moles, and metallic element B=2 moles. The amount of Bi from 1 to 1.1 times in a molar amount as great as the stoichiometric amount in the invention by the application of this formula would therefore be, when m=2, an amount of added Bi within a range of from 2 to 2.2 moles.

Because of a large amount of burnout loss of Bi, it has been the conventional practice to add Bi in a molar amount in excess of 1.15–1.3 times as great as the stoichiometric amount. Addition of Bi in such an excess may however sometimes lead to separation (segregation) of Bi-rich fine particles at grain boundaries. In the invention, a composite alkoxide of Bi and the hydrolytic treatment form strong bonds whereby metallic elements are bound one another. This permits inhibition of separation (segregation) of Bi and minimization of the burnout loss of metallic elements in the film. It is thus possible to reduce the amount of Bi in the coating solution to in a molar amount 1–1.1 times as great as the stoichiometric amount. This makes it possible to further reduce the amount of separation (segregation) of Bi, inhibit leakage current, and improve hydrogen heat treatment resistance as well as voltage resistance.

Composite metal alkoxide and the hydrolytic treatment make it possible to form a BLSF thin film whose percentage composition is closest to that of metallic elements in the coating solution.

Under the effect of the achievement of a composite compound, hydrolytic treatment and reduction of the amount of added Bi, separation of fine particles containing much Bi and other specific metallic elements at grain boundaries is inhibited and crystallinity of fine particles composed of the metallic elements can be improved even when using the RTP method believed to tend to cause separation (segregation) of metallic elements.

There is no particular limitation on the amounts of metallic elements A and B to be added, however, the amounts largely different from the stoichiometric ones are not desirable because a ratio of amount of each metallic element in the finally obtained BLSF thin film tends to deviate from that of the stoichiometric amount, and this may cause deterioration of such properties as saturation property, leakage current property, hydrogen heat treatment resistance and voltage resistance.

The coating solution of the invention is produced by dissolving one of those reaction products (organometallic compounds) in organic solvents having oxygen atoms in the molecules thereof. Examples of such solvents include alcohols, polyhydric alcohols, ethers, ketones, esters and lower carboxylic acids.

Exemplary alcoholic solvents include methanol, ethanol, propanol, butanol, amyl alcohol, cyclohexanol and methyl cyclohexanol.

Exemplary polyhydric alcohol-based solvents include ethylene glycol monomethyl ether, ethylene glycol monoacetate, diethylene glycol monomethyl ether, diethylene glycol monoacetate, propylene glycol monoethyl ether, propylene glycol monoacetate, dipropylene glycol monoethyl ether and methoxybutanol.

Exemplary ether-based solvents include methylal, diethyl ether, dipropylether, dibutylether, diamylether, diethylacetal, dihexyl ether, trioxane and dioxane.

Exemplary ketone-based solvents include acetone, methyl ethyl ketone, methyl propyl ketone, methyl isobutyl ketone, methyl amyl ketone, methyl cyclohexyl ketone, diethyl ketone, ethyl butyl ketone, trimethyl nonanone, acetonitrile acetone, dimethyl oxide, phorone, cyclohexanone and diacetone alcohol.

Exemplary ester based solvents include ethyl formate, methyl acetate, ethyl acetate, butyl acetate, cyclohexyl acetate, methyl propionate, ethyl butyrate, ethyl oxoisobutyrate, ethyl acetoacetate, ethyl lactate, methoxybutyl acetate, diethyl oxalate and diethyl malonate.

Exemplary lower carboxylic acid-based solvents include acetic acid, propionic acid, butyric acid, and valeric acid.

In the stabilizing treatment and treatment for achieving a composite compound of metallic compounds, reaction of these solvents, particularly alcoholic solvents, may partially be done with the metallic compounds.

The solvents listed above may be used either singly or in admixture.

The organometallic compounds of the invention are also highly soluble in aromatic hydrocarbon-based solvents; however, as already mentioned, these solvents are not preferred since they are subject to increasingly rigorous regulations on the methods of their use and management.

The selection of the most preferred solvent depends on specific coating conditions such as those of open spin coating, closed spin coating, liquid source misted chemical vapor deposition (LSM-CVD) and dip coating.

A method of producing a ferroelectric thin film and a ferroelectric memory using the coating solution of the invention will be described below with reference to FIGS. 1 and 2.

As shown in FIG. 1, a substrate 2 such as an Si wafer is first oxidized to form an Si oxide layer 3 which is overlaid with a lower electrode 4 that is formed from a metal such as Pt, Ir, Ru, Re or Os or a conductive metal oxide thereof by a known technique such as sputtering or vapor deposition. The lower electrode 4 is then coated with the coating solution of the invention by a known technique such as spin coating or dip coating and the applied coating is dried at a temperature of 50–200° C., followed by prebaking at a temperature of 200–700° C. Preferably, the process from the application of the coating solution to the prebaking of the dried coating is repeated several times until a desired film thickness is attained.

When the hydrolytic reaction is caused in a humidified atmosphere, it may be done, prior to the aforesaid prebaking, at a humidity of 50–100%, or preferably, 70–100%, and at a temperature of 50–120° C. for 10–60 minutes.

Subsequently, annealing is performed at a temperature of about 700–900° C. in an oxygen atmosphere to form a crystalline ferroelectric thin film 5. The annealing step may be performed by any suitable method such as furnace process in which the temperature is raised from room temperature to the annealing temperature at a rate of about 5–20° C./min, followed by annealing at that temperature for about 30–80 minutes, or a rapid thermal processing(RTP) method in which the temperature is raised from room temperature to the annealing temperature at a rate of about 50–150° C./sec, followed by annealing at that temperature for about 0.5–3 minutes. A satisfactory hysteresis curve is available even by conducting the annealing step at a low temperature of about 700° C. in the present invention.

Figure 2:
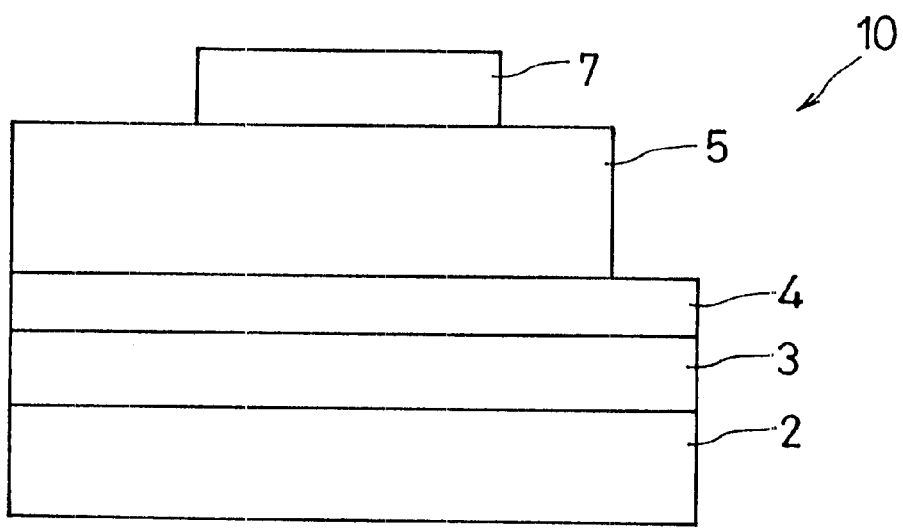
FIG. 2 shows schematically a structure of the ferroelectric capacitor forming the ferroelectric memory of the invention.

Then, as shown in FIG. 2, the thus prepared ferroelectric thin film 5 is overlaid with an electrode (upper electrode) 7, which may be formed of the metals or conductive metal oxides that have been listed in connection with the formation of the lower electrode 4; these materials are deposited on the ferroelectric thin film 5 by any known technique such as sputtering or vapor deposition and annealing (secondary annealing), as required, in an oxygen atmosphere to fabricate a ferroelectric capacitor 10. Particularly, when a Pt electrode is used as the upper electrode, the secondary annealing brings about a remarkable improvement of electrical characteristics. The secondary annealing, which is usually performed at a temperature of about 800–900° C., may be carried out at a lower temperature of about 700° C. in the present invention, and even in this case, a satisfactory hysteresis curve is available. The upper electrode 7 may be formed of a material different from that of the lower electrode 4; for instance, Ir may be used to make the lower electrode 4 whereas Ru may be used to make the upper electrode 7.

As described above, it is possible to reduce the amount of separation (segregation) and the burnout loss of metallic elements such as Bi in coating and annealing processes by converting metal alkoxides to composite metal alkoxides, followed by hydrolyzing them. Possibility of reducing the amount of separation (segregation) and burnout loss of Bi permits addition of Bi in an amount closest to the stoichimetric amount, thus making it possible to further reduce the amount of separation (segregation) and the burnout loss of Bi.

By performing various treatments such as carboxylation, conversion to β-diketone forms and chelation, the synthesis of polar and highly stable organometallic compounds could successfully be accomplished with improved hydrolyzability and subsequent applicability of practical polar solvents. As a result, a polycondensation reaction could be allowed to proceed through the sol-gel method in the coating solution by a sufficient degree, and production of inorganic bonds (metalloxane bonds) such as Bi—O—Bi, Bi—O—Ta, Bi—O—Sr, and Ta—O—Bi—O—Sr could further reduce separation (segregation) and burnout loss of Bi and other metallic elements, and enhance the inorganicity of the entire coating solution.

Particularly, leakage current could be inhibited and properties as a ferroelectric capacitor such as crystallinity, hydrogen heat treatment resistance and voltage resistance could be improved by the inhibition of separation (segregation) and burnout of metallic elements through enhancement of bonds between metallic elements as a result of achievement of the inorganicity by the formation of composite compounds and hydrolysis. Particularly according to the ferroelectric capacitor of the invention, a satisfactory hysteresis curve is available even when raising the applied voltage by about 18 V.

After formation of the upper electrode as described above, a protective film of $SiO_2$ or the like is formed (passivation) and an aluminum wiring is formed. Particularly, because of the excellent hydrogen heat treatment resistance, it is not necessary to worry about the risk of deterioration of ferroelectric properties upon forming the passivation film and upon sintering the aluminum wiring, and it became possible to apply the ferroelectric capacitor using the BLSF film to practical uses.

Even if the coating solution is not rendered fully inorganic by the sol-gel method (hydrolytic treatment) or even in the case of the coating solution which is not subjected to hydrolytic treatments at all, the as-applied coating on the substrate may be exposed to a humidified atmosphere for a certain period preceding the annealing step in forming a coating film as described above and by so doing, hydrolytic polycondensation will proceed to render the coating sufficiently inorganic to form a dense film.

An excessive hydrolytic treatment in the coating solution may potentially increase the viscosity of the coating solution gel or change its properties with time. The above-mentioned hydrolytic treatment of the as-applied coating prior to annealing in a forming a coating film is effective in order to avoid these possibilities.

It should be noted here that if an MOD coating solution made of a metal carboxylate having a long-chain organic group as described in connection with the prior art is applied onto a substrate and if the as-applied coating is subjected to a hydrolytic treatment prior to annealing in forming a coating film, the progress of the reaction is either uneven or negligible and there is a limit on the denseness of the coating to be finally formed.

It should also be noted that the contents of Bi, and metallic elements A and B in the coating solution for use in forming a Bi-based ferroelectric thin film are variable with the site and conditions of the application of the coating solution. Hence, appropriate formulations can be selected depending upon various conditions such as the type of the device to which the invention is to be applied (e.g., FRAM, DRAM, MFS, MFIS or MFMIS), the type of upper and lower electrodes to be used, their thickness, combinations of the two electrodes, the type of barrier layer, its thickness, and the presence or absence of a seed layer (orientation layer).

The contents of individual organometallic compounds, the type and amount of residual alkoxy group, the proportion of the carbonyl group to be incorporated, the degree of complex formation, the degree of hydrolysis, the degree of polycondensation and the degree of composite alkoxylation can be selected in many ways depending upon various factors such as the use of the coating solution of the invention and the conditions under which it is to be employed (e.g., temperature, time, atmosphere and the method of temperature elevation which are to be adopted in the drying and annealing steps). Therefore, the following examples of the invention are intended to describe just a few embodiments among the many fields of application of the invention and should in no way be taken as limiting.

A "1Tr-1C" DRAM having a memory cell which comprises a transistor and a capacitor is now most commonly used. In the following examples, therefore, experiments were carried out by means of a ferroelectric capacitor used in such a DRAM to evaluate properties of a ferroelectric memory.

EXAMPLES

Sr alkoxide used in the following Synthesis Examples (excluding Synthesis Examples 5 to 7) was prepared by adding metal Sr pieces little by little into methoxyethanol ($CH_3OC_2H_4OH$) to cause reaction.

Synthesis Example 1
(Synthesis of Coating Solution 1)
(Preparation of a Coating Solution Through Hydrolysis with $H_2O$ in a Molar Amount Two Times as Great as Mole of a Composite Metal Alkoxide of Sr, Bi and Ta)

$Bi(O-nC_4H_9)_3$ and $Ta(OC_2H_5)_5$ were dissolved in methoxyethanol (MC) and an MC solution of $Sr(OC_2H_4OCH_3)_2$ was dropped into it. The resultant mixed solution was adjusted to molar ratios of Sr:Bi:Ta=0.9 (in a molar amount 0.9 times as great as the stoichiometric amount):2.1 (in a molar amount 1.05 times as great as the stoichiometric amount):2.0 (in a molar amount equal to the stoichiometric amount).

After the completion of dropping, temperature was raised to 80° C., and reflux was conducted for ten hours: color of the solution changed from black into transparent brown. Then, heating was discontinued, and the solution was left to cool to a solution temperature of 25° C.

Subsequently, a composite metal alkoxide solution a [Sr:Bi:Ta=0.9:2.1:2.0 (molar ratio)] having a concentration of 20 wt % as converted into SrBiTa oxides was prepared by stirring the solution at 25° C. for 24 hours.

Then, a 12 wt % solution was prepared by diluting a part of the foregoing composite metal alkoxide solution a with MC. An MC solution containing $H_2O$ in a molar amount two times as great as a mole of the composite alkoxide contained in the solution was dropped and the resultant solution was stirred at 25° C. for two hours to synthesize a coating solution 1 for forming a Bi-based ferroelectric thin film, having a concentration of 10 wt %.

Synthesis Example 2
(Synthesis of Coating Solution 2)
(Preparation of a Coating Solution Through Conversion of a Composite Metal Alkoxide of Sr, Bi, Ta into β-diketonized and Glycolized One, Followed by Hydrolysis with $H_2O$ in a Molar Amount Two Times as Great as a Mole of the Composite Metal Alkoxide)

Using a part of the composite metal alkoxide solution a having a concentration of 20 wt % of Synthesis Example 1, an MC solution containing ethyl acetoacetate in a molar amount three times as great as a mole of the composite metal alkoxide contained in the above solution was dropped into the composite metal alkoxide solution and refluxed while heating to 80° C. for two hours.

The resultant solution was left to cool until the temperature decreased to 25° C., thereby giving a solution of a concentration of 15 wt %.

Then, an MC solution containing propylene glycol in an amount in moles equal to that of the composite metal alkoxide contained in the solution was added. The mixture was stirred at 25° C. for an hour into a solution having a concentration of 12 wt %. Further, an MC solution containing $H_2O$ in a molar amount two times as great as mole of the composite metal alkoxide contained in the solution was dropped, and the resultant mixed solution was stirred at 25° C. for two hours, thereby synthesizing a coating solution 2 for forming a Bi-based ferroelectric thin film, having a concentration of 10 wt %.

Synthesis Example 3
(Synthesis of Coating Solution 3)
(Preparation of a Coating Solution Through Conversion of a Composite Metal alkoxide of Sr, Bi, Ta into Carboxylic Anhydride Form, Followed by Hydrolysis with $H_2O$ in a Molar Amount Two Times as a Mole of the Composite Metal Alkoxide)

A coating solution 3 for forming a Bi-based ferroelectric thin film having a concentration of 10 wt % was synthesized in the same manner as in Synthesis Example 2 except that maleic anhydride was used in place of ethyl acetoacetate and propylene glycol was not employed.

Synthesis Example 4
(Synthesis of Coating Solution 4)
(Preparation of a Coating Solution Through Conversion of a Composite Metal Alkoxide of Sr, Bi, Ta into β-diketonized and Glycolized One, Followed by Hydrolysis with $H_2O$ in a Molar Amount four times as great as a mole of the composite metal alkoxide)

A coating solution 4 for forming a Bi-based ferroelectric thin film having a concentration of 10 wt % was synthesized in the same manner as in Synthesis Example 2 except that the amount of $H_2O$ using for hydrolysis was changed in a molar amount from two times to four times as great as mole of the composite metal alkoxide.

Synthesis Example 5
(Synthesis of Coating Solution 5)
(Preparation of a Coating Solution Through Conversion of a Composite Metal Alkoxide of Sr, Bi and a Ta Alkoxide into β-diketonized and Glycolized One, Followed by Hydrolysis with $H_2O$ in a Molar Amount Two Times as Great as a Mole of the Composite Metal Alkoxide)

$Bi(O-nC_4H_9)_3$ and $Sr(OCH_3)_2$ were dissolved in an MC, heated to 80° C., and refluxed for five hours: color of the solution changed from translucent yellow-white to transparent brown. Heating was then discontinued, and the solution was left to cool until temperature reached the level of 25° C., thereby preparing a composite metal alkoxide solution [Sr:Bi=0.9:2.1 (molar ratio)] having a concentration of 20 wt % as converted into SrBi oxides.

An MC solution containing ethyl acetoacetate in a molar amount two times as great as a mole of the composite metal alkoxide contained in that solution was dropped, and the mixed solution was refluxed while heating to 800C for two hours, thereby preparing a first solution.

To an MC solution of $Ta(OC_2H_5)_5$ in a concentration of 20 wt %, another MC solution containing ethyl acetoacetate in a molar amount three times as great as a mole of $Ta(OC_2H_5)_5$ contained in that solution was dropped, and the resultant solution was refluxed while heating to 80° C. for two hours, thereby preparing a second solution.

Then, the second solution was dropped into the first solution to adjust the molar ratio Sr:Bi:Ta to 0.9:2.1:2.0.

Then, an MC solution containing propylene glycol in a molar amount equal to a mole of the composite metal alkoxide contained in that solution was added. The resultant mixed solution was stirred at 25° C. for an hour, giving a solution having a concentration of 12 wt %. Further, an MC solution containing $H_2O$ in a molar amount two times as great as a mole of the composite metal alkoxide contained in that solution was dropped, and the resultant solution was stirred at 25° C. for two hours, thereby synthesizing a coating solution 5 for forming a Bi-based ferroelectric thin film, having a concentration of 10 wt %.

Synthesis Example 6
(Synthesis of Coating Solution 6)
(Preparation of a Coating Solution Through Conversion of a Composite Metal Alkoxide of Bi, Ta and an Sr Alkoxide into β-diketonize and Glycolize, Followed by Hydrolysis with $H_2O$ in a Molar Amount Two Times as Great as a Mole of the Composite Metal Alkoxide)

A composite metal alkoxide solution [Bi:Ta=2.1:2.0 (molar ratio)] having a concentration of 20 wt % as converted into BiTa oxides was prepared in the same manner as in Synthesis Example 5.

An MC solution containing ethyl acetoacetate of in a molar amount three times as great as a mole of the composite metal alkoxide contained in the above solution was dropped, and the resultant solution was refluxed while heating to 80° C. for two hours, thereby preparing a first solution.

To an MC solution of $Sr(OCH_3)_2$ in a concentration of 20 wt %, another MC solution containing ethyl acetoacetate in a molar amount two times as great as a mole of $Sr(OCH_3)_2$ contained in that solution was dropped, and the resultant solution was refluxed for two hours while heating to 80° C., thereby preparing a second solution.

Then, the molar ratio was adjusted by dropping the second solution into the first solution to achieve Sr:Bi:Ta of 0.9:2.1:2.0.

Then, an MC solution containing propylene glycol in a molar amount equal to a mole of the composite metal alkoxide contained in the above solution was added, and the resultant solution was stirred at 25° C. for an hour, thereby giving a solution having a concentration of 12 wt %. Further, an MC solution containing $H_2O$ in a molar amount two times as great as a mole of the composite metal alkoxide contained in that solution was dropped, and the solution was stirred at 25° C. for two hours, thereby synthesizing a coating solution 6 for forming a Bi-based ferroelectric thin film, having a concentration of 10 wt %.

Synthesis Example 7
(Synthesis of Coating Solution 7)
(Preparation of a Coating Solution Through Conversion of a Composite Metal Alkoxide of Sr, Ta and a Bi Alkoxide into β-diketonized and Glycolized One, Followed by Hydrolysis with $H_2O$ in a Molar Amount Two Times as Great as Mole of the Composite Metal Alkoxide)

A composite metal alkoxide solution [Sr:Ta=0.9:2.0 (molar ratio)] having a concentration of 20 wt % as converted into SrTa oxides was prepared in the same manner as in Synthesis Example 5.

An MC solution containing ethyl acetoacetate in a molar amount three times as great as a mole of the composite metal alkoxide contained in that solution was dropped, and the resultant solution was refluxed for two hours while heating to 80° C., thereby preparing a first solution.

To an MC solution of $Bi(O-nC_4H_9)_3$ in a concentration of 20 wt %, another MC solution containing ethyl acetoacetate in a molar amount equal to a mole of $Bi(O-nC_4H_9)_3$ contained in that solution was dropped, and the resultant solution was refluxed for two hours while heating to 80° C., thereby preparing a second solution.

Then, the molar ratio was adjusted by dropping the second solution into the first solution to achieve Sr:Bi:Ta=0.9:2.1:2.0.

Then, an MC solution containing propylene glycol in a molar amount equal to a mole of the composite metal alkoxide contained in the solution was added, and the resultant solution was stirred at 25° C. for an hour, thereby giving a solution having a concentration of 12 wt %. Further, an MC solution containing $H_2O$ in a molar amount two times as great as a mole of the composite metal alkoxide contained in that solution was dropped, and the solution was stirred at 25° C. for two hours, thereby synthesizing a coating solution 7 for forming a Bi-based ferroelectric thin film, having a concentration of 10 wt %.

Synthesis Example 8
(Synthesis of Coating Solution 8)
(Preparation of a Coating Solution Through Hydrizing a Composite Metal Alkoxide of Sr, Bi, Ta with $H_2O$ in a Molar Amount Two Times as Great as a Mole of the Composite Metal Alkoxide, Followed by Conversion Them into β-diketonized One)

Using a part of the composite metal alkoxide solution a in a concentration of 20 wt % of Example 1, an MC solution containing $H_2O$ in a molar amount two times as great as a mole of the composite metal alkoxide contained in that solution was dropped, and the resultant solution was stirred for two hours.

Then, an MC solution containing ethyl acetoacetate in a molar amount two times as great as mole of the composite metal alkoxide contained in that solution was dropped, and the resultant solution was refluxed while heating to 80° C. for two hours, thereby synthesizing a coating solution 8 for forming a Bi-based ferroelectric thin film, having a concentration of 10 wt %.

Synthesis Example 9
(Synthesis of Coating Solution 9)
(Preparation of a Coating Solution Through Conversion of a Composite Metal Alkoxide of Sr, Bi, Ta into β-diketonized and Glycolized One, Followed by Hydrolysis with $H_2O$ in a Molar Amount Two Times as Great as a Mole of the Composite Metal Alkoxide)

A coating solution 9 for forming a Bi-based ferroelectric thin film, having a concentration of 10 wt % was synthesized in the same manner as in the Synthesis Example 2 except that the molar ratio was changed to Sr:Bi:Ta=0.9:2.2 (in a molar amount 1.1 times as great as the stoichiometric amount):2.0.

Synthesis Example 10
(Synthesis of Coating Solution 10)
(Preparation of a Coating Solution Through Conversion of a Composite Metal Alkoxide of Sr, Bi, Ta into β-diketonized and Glycolized One, Followed by Hydrolysis with $H_2O$ in a Molar Amount Two Times as Great as a Mole of the Composite Metal Alkoxide)

A coating solution 10 for forming a Bi-based ferroelectric thin film, having a concentration of 10 wt % was synthesized in the same manner as in the Synthesis Example 2 except that the molar ratio was changed to Sr:Bi:Ta=0.7 (in a molar amount 0.7 times as great as the stoichiometric amount): 2.1:2.0.

Synthesis Example 11
(Synthesis of Coating Solution 11)
(Preparation of a Coating Solution Through Conversion of a Composite Metal Alkoxide of Sr, Bi, Ta into β-diketonized and Glycolized One, Followed by Hydrolysis with $H_2O$ in a Molar Amount Two Times as Great as a Mole of the Composite Metal Alkoxide)

A coating solution 11 for forming a Bi-based ferroelectric thin film, having a concentration of 10 wt % was synthesized in the same manner as in Synthesis Example 2 except that $Sr(OC_2H_4OCH_3)_2$ was changed to $Sr(O-isoC_3H_7)_2$.

Comparative Synthesis Example 1
(Synthesis of Comparative Coating Solution 1)
(Preparation of a Coating Solution Through Conversion of a Composite Metal Alkoxide of Sr, Bi, Ta into β-diketonized and Glycolized One, Followed by Hydrolysis with $H_2O$ in a Molar Amount Two Times as Great as a Mole of the Composite Metal Alkoxide)

A comparative coating solution 1 for forming a Bi-based ferroelectric thin film, having a concentration of 10 wt % was synthesized in the same manner as in Synthesis Example 2 except that the molar ratio was changed to Sr:Bi:Ta=0.9:2.4 (in a molar amount 1.2 times as great as the stoichiometric amount):2.0.

Comparative Synthesis Example 2
(Synthesis of Comparative Coating Solution 2)
(Preparation of a Coating Solution Through Mixture of Metal Alkoxides of Sr, Bi and Ta)

Bi(O-nC$_4$H$_9$)$_3$ and Ta(OC$_2$H$_5$)$_5$ were dissolved in MC, and an MC solution of Sr(OC$_2$H$_4$OCH$_3$)$_2$ was dropped into the resultant solution to adjust the molar ratio to Sr:Bi:Ta= 0.9:2.1:2.0.

After stirring at room temperature for 24 hours, the solvent was distilled off under reduced pressure, and the solution was concentrated to a concentration of 10 wt %, thereby synthesizing a comparative coating solution 2 for forming a Bi-based ferroelectric thin film.

Examples 1 to 11 and Comparative Examples 1 and 2

I. Ferroelectric Thin Films

A Pt lower electrode having a thickness of 60 nm was formed by sputtering on a silicon wafer having a diameter of 6 inches and having a 100 nm-thick thermo-oxidized SiO$_2$ film formed thereon.

Then, coating solutions 1 to 10 obtained in the foregoing Synthesis Examples and comparative coating solutions 1 and 2 obtained in Comparative Synthesis Examples were coated onto the aforesaid Pt lower electrode by means of a spin coater at 500 rpm for five seconds and then at 2,000 rpm for 30 seconds. After drying at 150° C. for 30 minutes, prebaking was conducted at 650° C. for 30 minutes. The foregoing operations from coating to prebaking were repeated ten times. After that, a temperature was elevated in an oxygen atmosphere from 25° C. to 800° C. at a heating rate of 10° C./minute. Subsequently, annealing (primary annealing) was applied in the oxygen atmosphere at 800° C. for 60 minutes, thereby forming ferroelectric thin films having a thickness of 300 nm.

In Example 11, a 300 nm-thick ferroelectric thin film was formed in the same manner as above except that, using the coating solution 11, the prebaking temperature was changed from 650° C. to 450° C. and the primary annealing temperature, from 800° C. to 700° C.

[Measurement of Separation (Segregation) of Bi Particles]

The Bi content in crystallized particles present in a thin film and the Bi content between crystallized particles (grain boundaries) in the foregoing ferroelectric thin films were analyzed by the energy dispersive X-ray spectroscopy (EDX). The results are shown in Table 1: a case where Bi content relative to Sr, Ta in particles exceeds one at grain boundaries is marked ×, and a case where Bi content relative to Sr, Ta in particles is nearly equal to one at grain boundaries is marked ○.

II. Ferroelectric Capacitors

Figure 3:
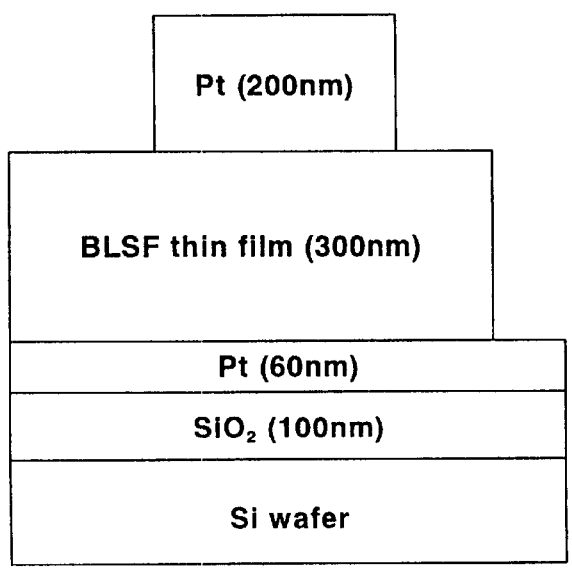
FIG. 3 shows schematically a structure of the ferroelectric capacitor used in Examples of the invention.
Figure 4:
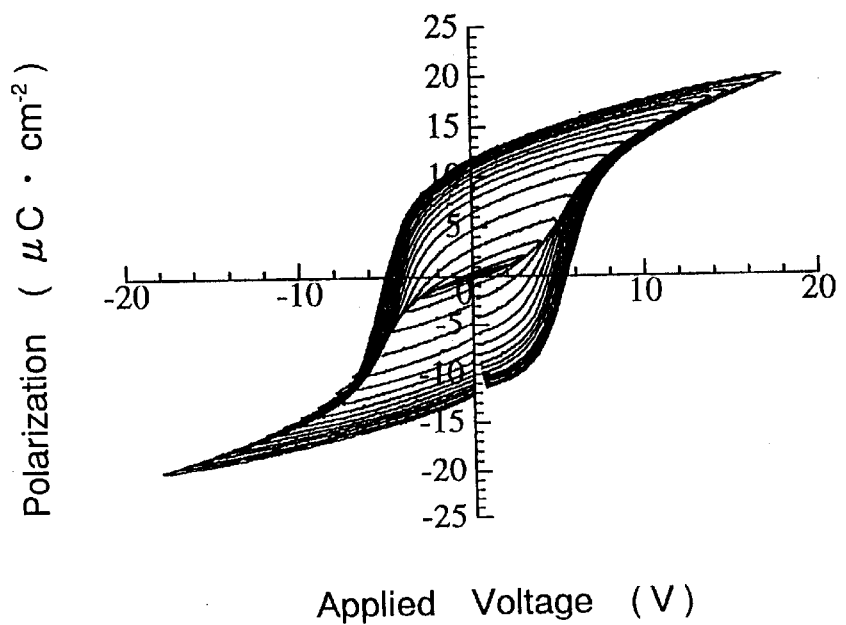
FIG. 4 is a graph illustrating hysteresis characteristic in Example 1 of the invention.
Figure 5:
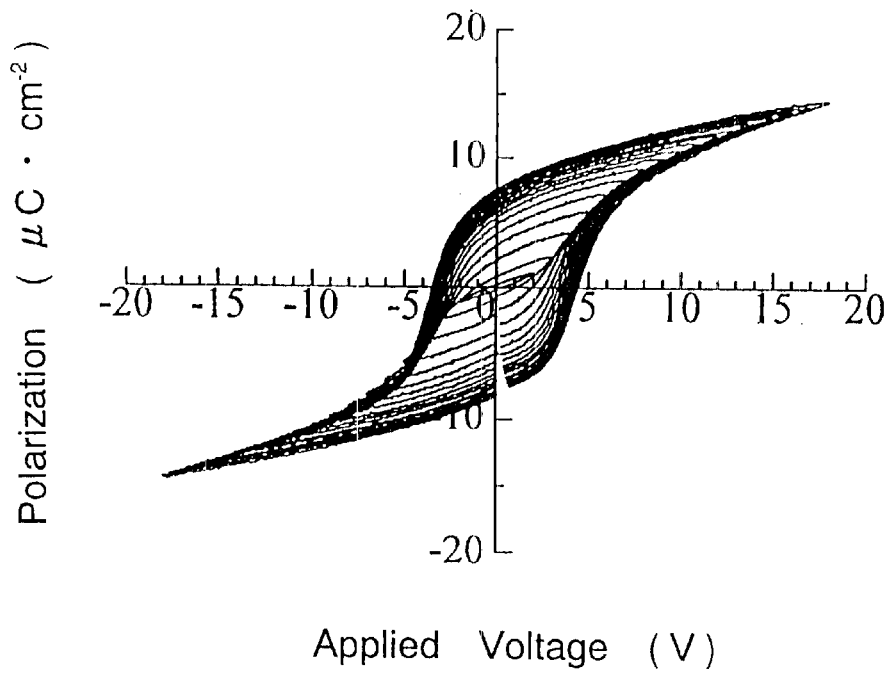
FIG. 5 is a graph illustrating hysteresis characteristic in Example 2 of the invention.
Figure 6:
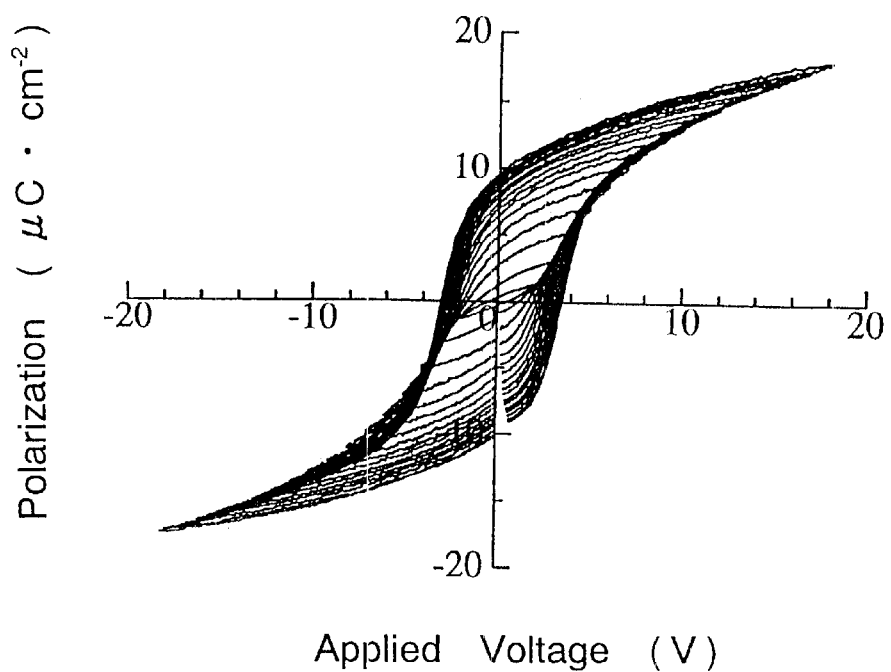
FIG. 6 is a graph illustrating hysteresis characteristic in Example 3 of the invention.
Figure 7:
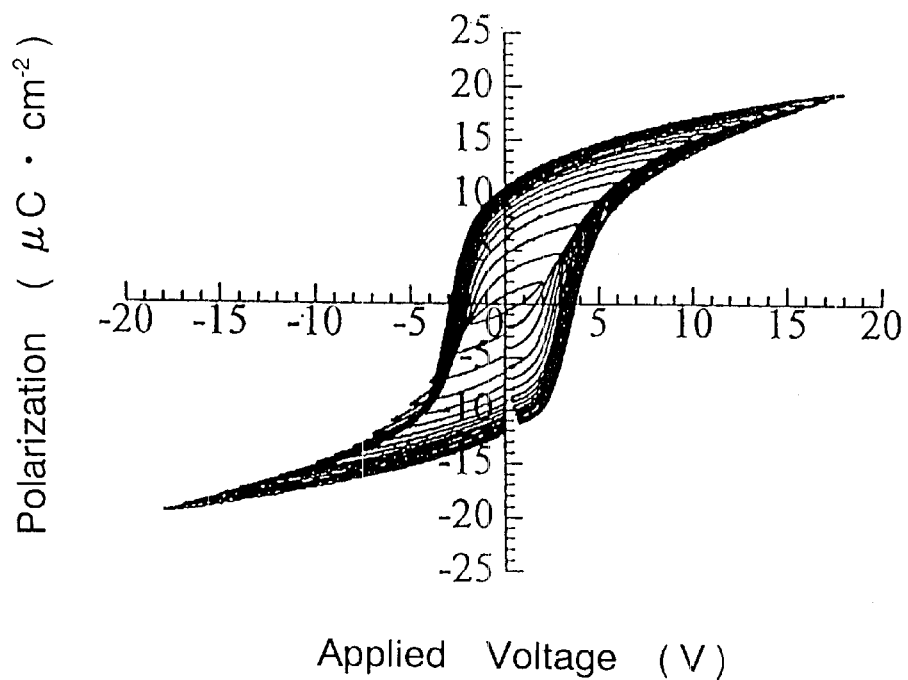
FIG. 7 is a graph illustrating hysteresis characteristic in Example 4 of the invention.
Figure 8:
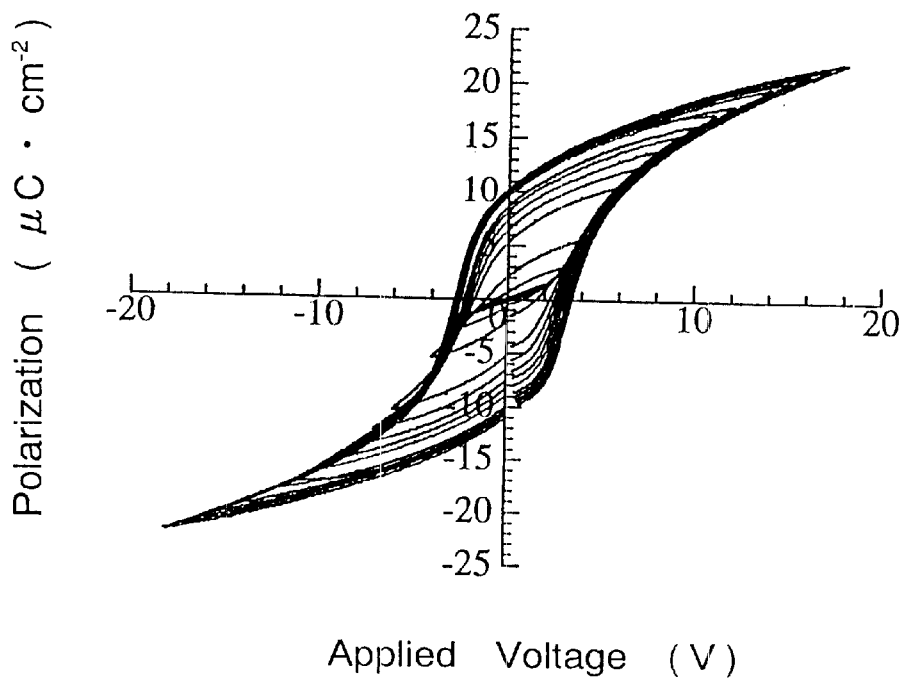
FIG. 8 is a graph illustrating hysteresis characteristic in Example 5 of the invention.
Figure 9:
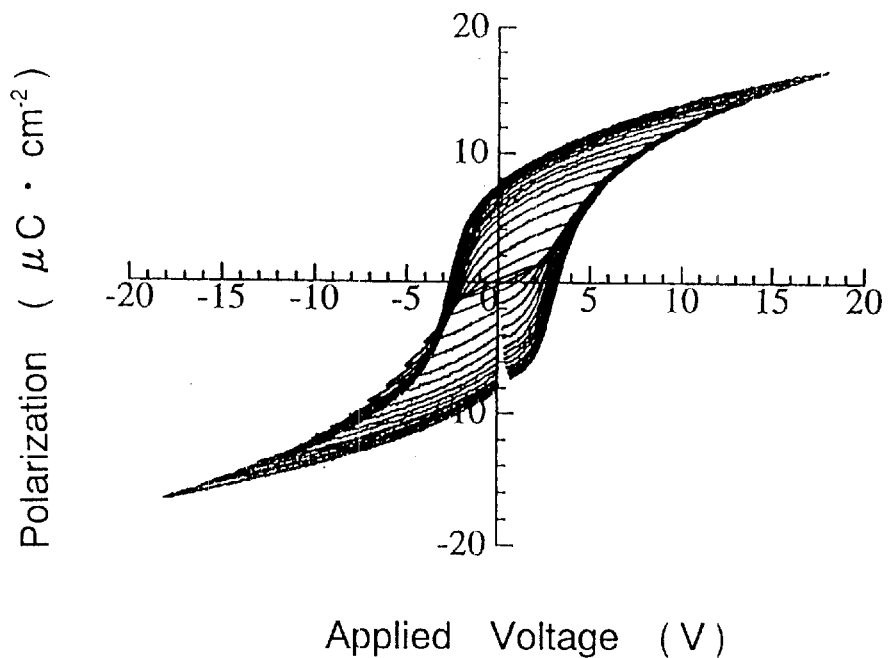
FIG. 9 is a graph illustrating hysteresis characteristic in Example 6 of the invention.
Figure 10:
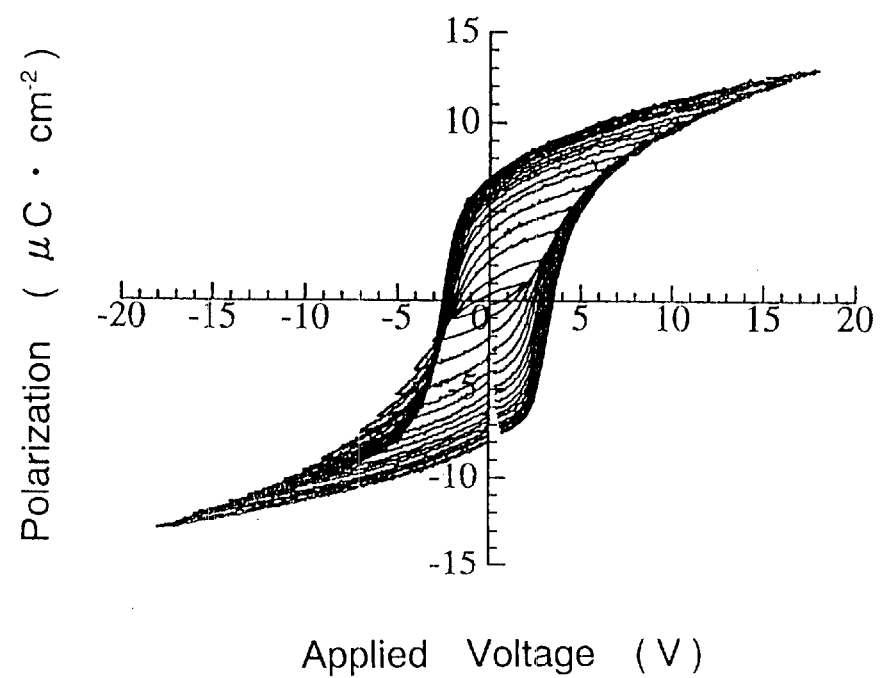
FIG. 10 is a graph illustrating hysteresis characteristic in Example 7 of the invention.
Figure 11:
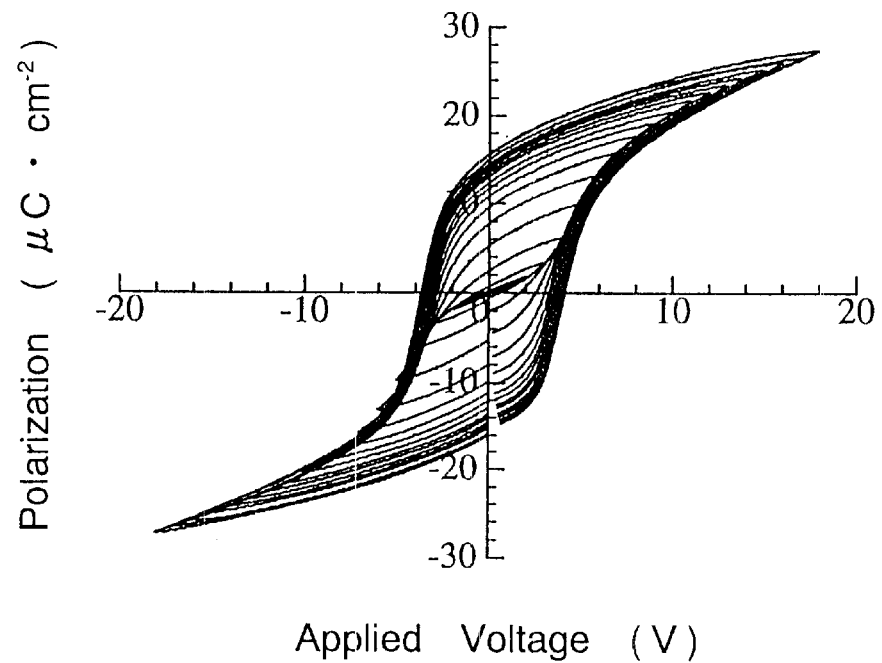
FIG. 11 is a graph illustrating hysteresis characteristic in Example 8 of the invention.
Figure 12:
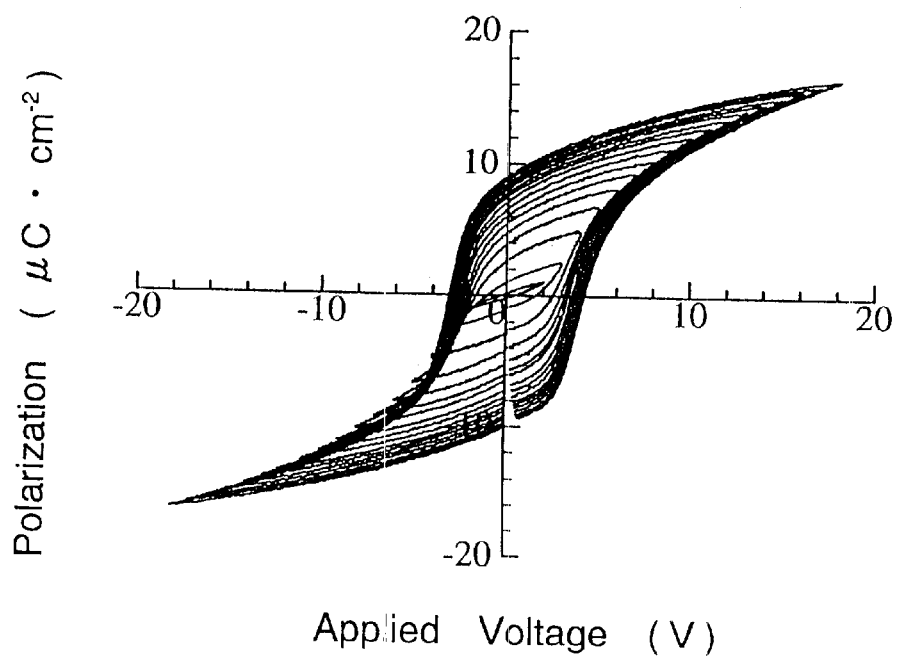
FIG. 12 is a graph illustrating hysteresis characteristic in Example 9 of the invention.
Figure 13:
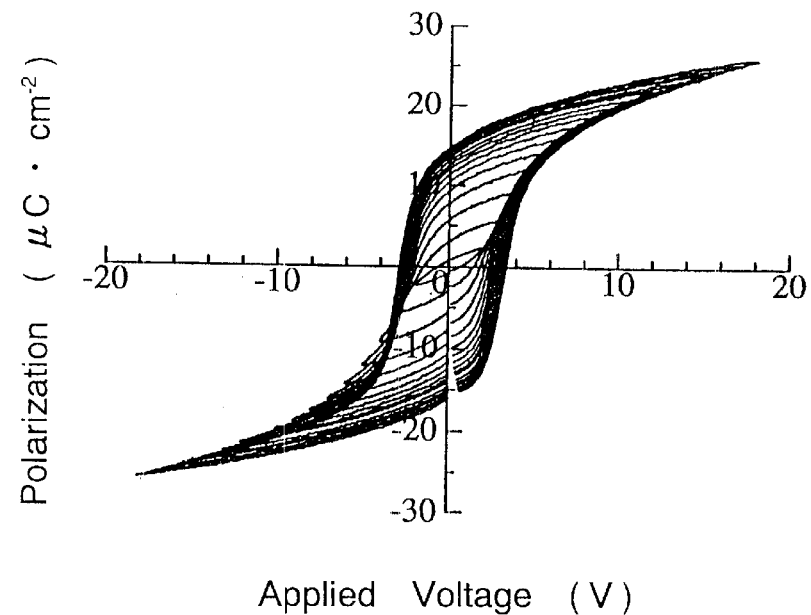
FIG. 13 is a graph illustrating hysteresis characteristic in Example 10 of the invention.

A Pt upper electrode having a diameter of 0.2 mm and a thickness of 200 nm was then formed on the aforesaid ferroelectric thin film via a metal mask by sputtering, and annealing (secondary annealing) was applied in an oxygen atmosphere at 800° C. for 30 minutes, thereby preparing a ferroelectric capacitor. In Example 11, the secondary annealing was carried out at 700° C. in place of 800° C. A configuration is shown in FIG. 3.

Figure 14:
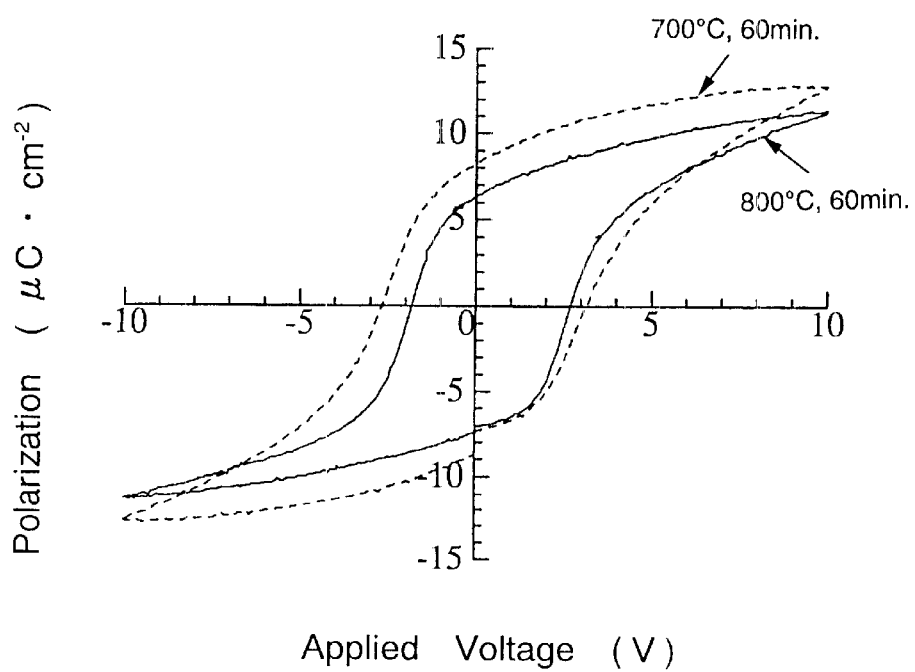
FIG. 14 is a graph illustrating hysteresis characteristic in Examples 2 and 11 of the invention.

The ferroelectric capacitors formed with the coating solutions 1 to 11 exhibited satisfactory hysteresis curves with a high square ratio at an applied voltage within a range of from 2 to 18 V. Even at an applied voltage of 18 V, these capacitors showed a good hysteresis characteristic with a satisfactory voltage resistance. Particularly in Example 11, a satisfactory hysteresis curve was obtained although both the primary annealing and the secondary annealing were carried out at a low temperature of 700° C. The results are shown in FIGS. 4 to 14. FIGS. 4 to 13 respectively correspond to Examples using the coating solutions 1 to 10 (Examples 1 to 10). FIG. 14 illustrates hysteresis curves at an applied voltage of 10 V in the ferroelectric capacitors prepared in Examples 2 and 11.

Figure 15:
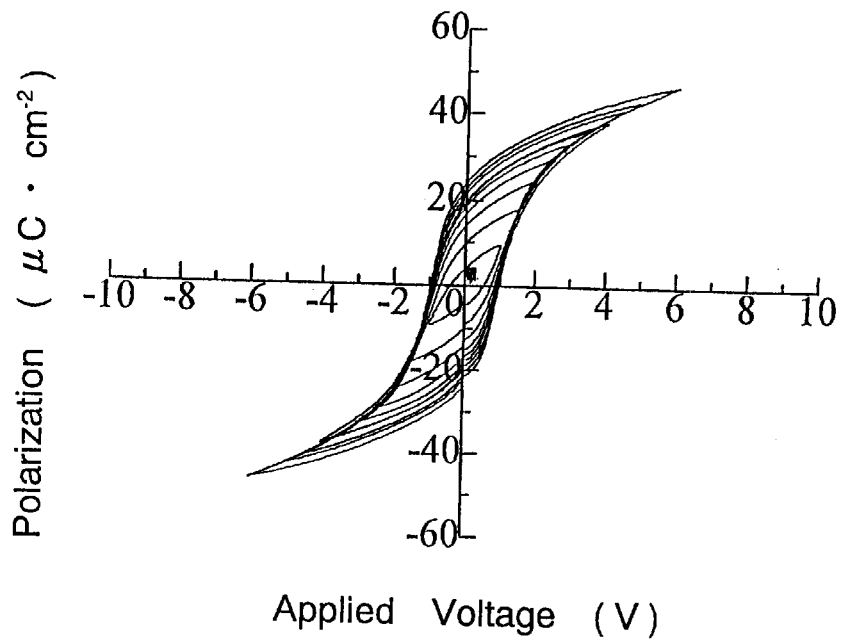
FIG. 15 is a graph illustrating hysteresis characteristic in Comparative example 1 of the invention.
Figure 16:
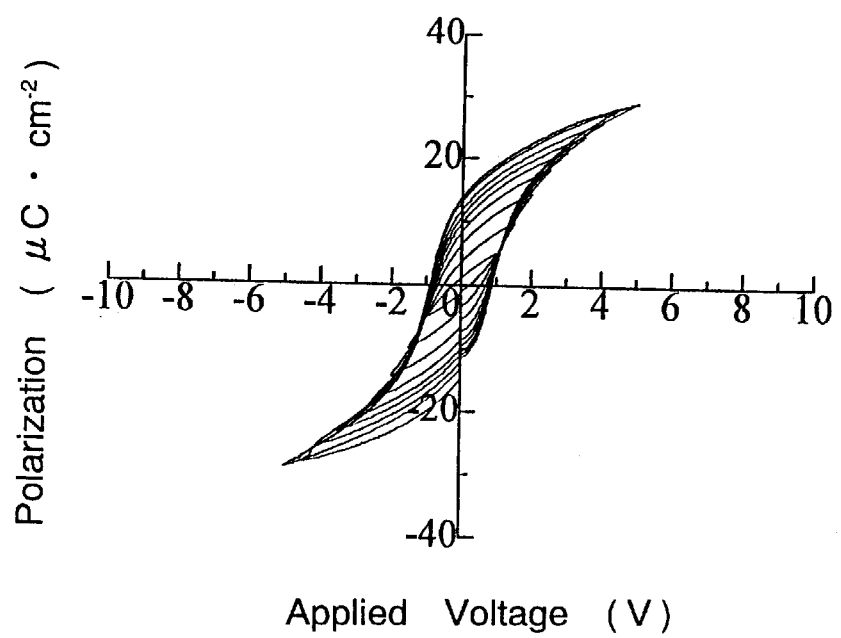
FIG. 16 is a graph illustrating hysteresis characteristic in a comparative example 2 of the invention.

When using the comparative coating solution 1 or 2, a satisfactory hysteresis curve with a high square ratio is unavailable. When using the comparative coating solution 1, hysteresis property can no more be obtained at an applied voltage of over 6.5 V. When using the comparative coating solution 2, a hysteresis property becomes unavailable at an applied voltage of over 5.5 V, suggesting that both the comparative coating solutions had a low voltage resistance. These results are shown in FIGS. 15 (Comparative Example 1) and 16 (Comparative Example 2).

[Measurement of Leakage Current]

In the ferroelectric capacitor, a circuit is formed between the upper Pt electrode and the lower Pt electrode to investigate leakage current density (A/cm$^2$) in application of 5 V: the mark ◉ represents a value of density under $10^{-7}$; ○, from $10^{-7}$ to under $10^{-6}$; Δ, from $10^{-6}$ to under $10^{-5}$; and ×, $10^{-5}$ and over. The results are shown in Table 1.

[Measurement of Hydrogen Heat Treatment Resistance]

A ferroelectric capacitor formed with the coating solution 4 was subjected to a heat treatment in an atmosphere comprising 10% hydrogen and 90% nitrogen at 400° C. for 15 minutes.

Figure 19:
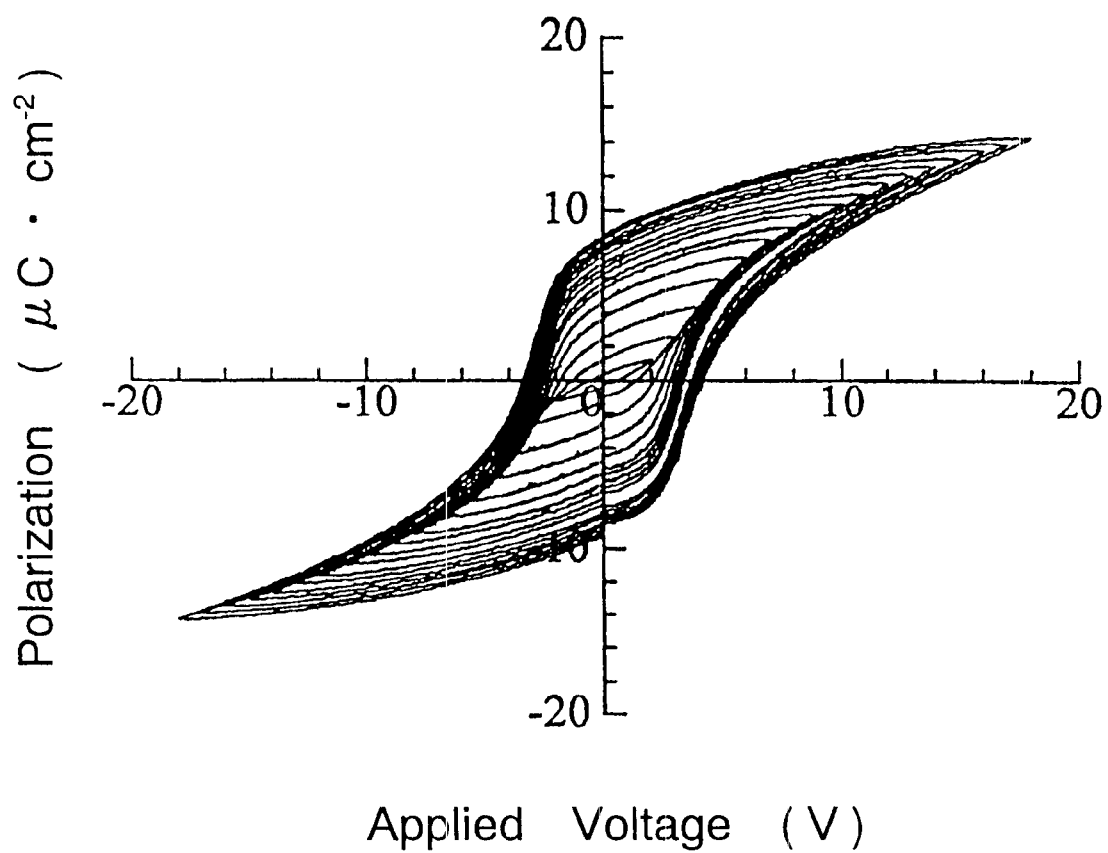
FIG. 19 is a graph illustrating hysteresis characteristic after hydrogen heat treatment in Example 4.

For the ferroelectric capacitor after treatment, a hysteresis curve at an applied voltage of 2 to 18 V is shown in FIG. 19.

These results suggest that, as compared with the hysteresis curve before the aforesaid treatment (FIG. 7), there is no marked change in hysteresis property, and a satisfactory resistance is exhibited as represented by the hysteresis property even at an applied voltage of 18 V.

It is confirmed from the above that the ferroelectric capacitor formed by the use of the coating solution 4 containing Bi in a molar amount 1.05 times as great as the stoichiometric amount and subjected to a hydrolysis is resistant to the reducing action exerted by the heat treatment in a hydrogen atmosphere, and the film is almost completely free from deterioration.

Example 12 and Comparative Example 3

The coating solution 2 and the comparative coating solution 2 were evaluated for the above Examples and Comparative Examples in the same manner as above except that the heating rate of the primary annealing was changed from 10° C./min to 125° C./sec, and the annealing time from 60 minutes to a minute.

Figure 17:
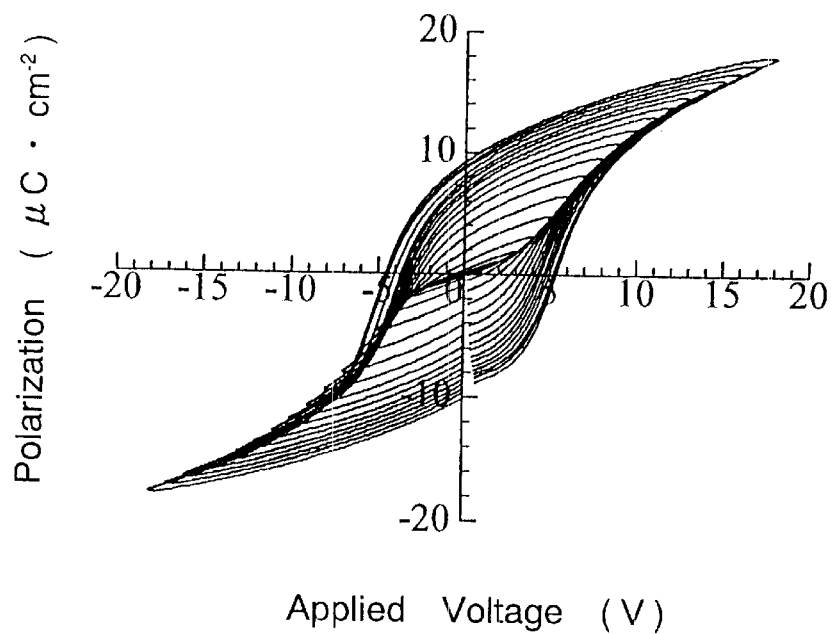
FIG. 17 is a graph illustrating hysteresis characteristic in Example 12 of the invention.

The ferroelectric capacitor formed with the use of the coating solution 2 showed a satisfactory hysteresis curve with a high square ratio at an applied voltage of 2 to 18 V. Even at an applied voltage of 18 V, it exhibited a hysteresis property, suggesting a good voltage resistance. The results are shown in FIG. 17.

Figure 18:
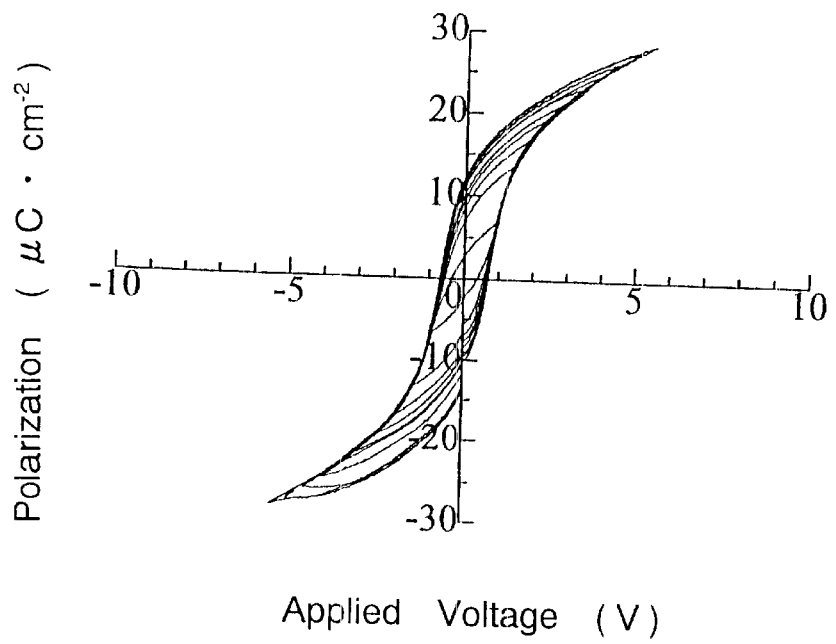
FIG. 18 is a graph illustrating hysteresis characteristic in Comparative example 3 of the invention.

When using the comparative coating solution 2, on the other hand, a satisfactory hysteresis curve with a high square ratio is unavailable, and at an applied voltage of over 6 V, hysteresis characteristic becomes unavailable, thus suggesting a low voltage resistance. The results are shown in FIG. 18.

Results regarding the Bi contents in these two ferroelectric thin films (EDX evaluation) and leakage current in the ferroelectric memories are shown in Table 1.

TABLE 1

| Example | Coating solution | Composite metal alkoxides | Stabilizer | Hydrolysis (molar number) | Sr:Bi:Ta (molar ratio) | Separation of Bi particles (EDX evaluation) | Leakage current evaluation |
|---|---|---|---|---|---|---|---|
| Example 1 | Coating solution 1 | SrBiTa composite alkoxide | — | 2 | 0.9:2.1:2.0 | ○ | ○ |
| Example 2 | Coating solution 2 | SrBiTa composite alkoxide | Ethyl acetoacetate, Propylene glycol | 2 | 0.9:2.1:2.0 | ○ | ◎ |
| Example 3 | Coating solution 3 | SrBiTa composite alkoxide | Meleic anhydride | 2 | 0.9:2.1:2.0 | ○ | ○ |
| Example 4 | Coating solution 4 | SrBiTa composite alkoxide | Ethyl acetoacetate, Propylene glycol | 4 | 0.9:2.1:2.0 | ○ | ◎ |
| Example 5 | Coating solution 5 | [SrBi composite alkoxide] + [Ta alkoxide] | Ethyl acetoacetate, Propylene glycol | 2 | 0.9:2.1:2.0 | ○ | ○ |
| Example 6 | Coating solution 6 | [BiTa composite alkoxide] + [Sr alkoxide] | Ethyl acetoacetate, Propylene glycol | 2 | 0.9:2.1:2.0 | ○ | ○ |
| Example 7 | Coating solution 7 | [SrTa composite alkoxide] + [Bi alkoxide] | Ethyl acetoacetate, Propylene glycol | 2 | 0.9:2.1:2.0 | ○ | Δ |
| Example 8 | Coating solution 8 | SrBiTa composite alkoxide | Ethyl acetoacetate | 2 | 0.9:2.1:2.0 | ○ | ○ |
| Example 9 | Coating solution 9 | SrBiTa composite alkoxide | Ethyl acetoacetate, Propylene glycol | 2 | 0.9:2.2:2.0 | ○ | Δ |
| Example 10 | Coating solution 10 | SrBiTa composite alkoxide | Ethyl acetoacetate, Propylene glycol | 2 | 0.7:2.1:2.0 | ○ | ○ |
| Example 11 | Coating solution 11 | SrBiTa composite alkoxide | Ethyl acetoacetate, Propylene glycol | 2 | 0.9:2.1:2.0 | ○ | ◎ |
| Comparative Example 1 | Comparative Coating solution 1 | SrBiTa composite alkoxide | Ethyl acetoacetate, Propylene glycol | 2 | 0.9:2.4:2.0 | X | X |
| Comparative Example 2 | Comparative Coating solution 2 | Sr(OR) + Bi(OR) + Ta(OR) | — | — | 0.9:2.1:2.0 | X | X |
| Example 12 | Coating solution 2 | SrBiTa composite alkoxide | Ethyl acetoacetate, Propylene glycol | 2 | 0.9:2.1:2.0 | ○ | ◎ |
| Comparative Example 3 | Comparative Coating solution 2 | Sr(OR) + Bi(OR) + Ta(OR) | — | — | 0.9:2.1:2.0 | X | X |

Example 12 and Comparative Example 3 were carried out by the RTP method.

According to the present invention, as described above in detail, there is provided a coating solution for forming a Bi-based ferroelectric thin film, which is capable of forming a dense film hardly suffering separation of excessive particles of metallic elements, giving little leakage current, and excellent in hydrogen heat treatment resistance and voltage resistance, with a high keeping stability. By using this coating solution, it is possible to form a ferroelectric thin film, a ferroelectric capacitor and a ferroelectric memory at a low cost, with improved film density and surface morphology.

What is claimed is:

1. A ferroelectric thin film formed by applying a coating solution for use in forming Bi-based ferroelectric thin films containing Bi, metallic element A which is at least one metallic element selected from the group consisting of Bi, Pb, Ba, Sr, Ca, Na, K and rare earth elements and metallic element B which is at least one metallic element selected from the group consisting of Ti, Nb, Ta, W, Mo, Fe, Co and Cr, wherein it contains metal alkoxides of Bi, metallic element A as defined hereabove and metallic element B as defined hereabove respectively, and an organometallic compound obtained by hydrolyzing composite metal alkoxides, formed by any two or more of said metal alkoxides, with water alone or in combination with a catalyst, and contains Bi in a molar amount 1–1.1 times as great as the stoichiometric amount, onto an electrode on a substrate and then annealing the applied coating.

2. A ferroelectric thin film formed by applying a coating solution for use in forming Bi-based ferroelectric thin films containing Bi, metallic element A which is at least one metallic element selected from the group consisting of Bi, Pb, Ba, Sr, Ca, Na, K and rare earth elements and metallic element B which is at least one metallic element selected from the group consisting of Ti, Nb, Ta, W, Mo, Fe, Co and Cr, wherein it contains metal alkoxides of Bi, metallic element A as defined hereabove and metallic element B as defined hereabove respectively, and an organometallic compound obtained by hydrolyzing composite metal alkoxides, formed by any two or more of said metal alkoxides, with water alone or in combination with a catalyst, and contains Bi in a molar amount 1–1.1 times as great as the stoichiometric amount, onto an electrode on a substrate, exposing the applied coating to a humidified atmosphere and then annealing said coating.

3. A ferroelectric capacitor having an electrode formed on the ferroelectric thin film of claim 1.

4. A ferroelectric memory using the ferroelectric capacitor of claim 3.

5. A ferroelectric capacitor having an electrode formed on the ferroelectric thin film of claim 2.

6. A ferroelectric memory using the ferroelectric capacitor of claim 5.

7. A process for producing a ferroelectric thin film by the steps of

I forming an electrode over a substrate;

II applying a coating solution for use in forming a ferroelectric thin film onto said electrode; and III annealing the applied coating;

wherein said process uses, as said coating solution for use in forming ferroelectric thin films, a Bi-based coating solution for use in forming ferroelectric thin films, containing Bi, metallic element A which is at least one metallic element selected from the group consisting of Bi, Pb, Ba, Sr, Ca, Na, K and rare earth elements and metallic element B which is at least one metallic element selected from the group consisting of Ti, Nb, Ta, W, Mo, Fe, Co and Cr, wherein it contains metal alkoxides of Bi, metallic element A as defined hereabove and metallic element B as defined hereabove, respectively, and an organometallic compound obtainable by hydrolyzing composite metal alkoxides, formed by any two or more of said metal alkoxides, with water alone or in combination with a catalyst, and contains Bi in a molar amount 1–1.1 times as great as the stoichiometric amount.

8. A process for producing a ferroelectric capacitor by the steps of

I forming an electrode over a substrate;

II applying a coating solution for use in forming a ferroelectric thin film onto said electrode;

III annealing the applied coating to form a ferroelectric thin film; and

IV forming an electrode onto said ferroelectric thin film; wherein said process uses, as said coating solution for use in forming ferroelectric thin films, a Bi-based coating solution for use in forming ferroelectric thin films, containing Bi, metallic element A which is at least one metallic element selected from the group consisting of Bi, Pb, Ba, Sr, Ca, Na, K and rare earth elements and metallic element B which is at least one metallic element selected from the group consisting of Ti, Nb, Ta, W, Mo, Fe, Co and Cr, wherein it contains metal alkoxides of Bi, metallic element A as defined hereabove and metallic element B as defined hereabove, respectively, and an organometallic compound A obtainable by hydrolyzing a composite metal alkoxides, formed by any two or more of said metal alkoxides, with water alone or in combination with a catalyst, and contains Bi in a molar amount 1–1.1 times as great as the stoichiometric amount.

9. The process for producing a ferroelectric capacitor according to claim 8, wherein said step IV includes a secondary annealing step.

10. The process for producing a ferroelectric capacitor according to claim 9, wherein said secondary annealing is performed at a temperature of about 700° C.

* * * * *